(12) United States Patent
Hagisawa et al.

(10) Patent No.: US 9,287,832 B2
(45) Date of Patent: Mar. 15, 2016

(54) POWER AMPLIFYING MODULE

(71) Applicant: Murata Manufacturing Co., Ltd., Nagaokakyo-shi, Kyoto-fu (JP)

(72) Inventors: Hiroshi Hagisawa, Nagaokakyo (JP); Satoshi Sakurai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 18 days.

(21) Appl. No.: 14/196,408

(22) Filed: Mar. 4, 2014

(65) Prior Publication Data
US 2014/0253243 A1  Sep. 11, 2014

(30) Foreign Application Priority Data

Mar. 5, 2013 (JP) ................. 2013-042908

(51) Int. Cl.
| H03F 3/04 | (2006.01) |
| H03F 1/30 | (2006.01) |
| H03F 3/19 | (2006.01) |
| H03F 3/21 | (2006.01) |
| H03F 3/24 | (2006.01) |

(52) U.S. Cl.
CPC ................. *H03F 1/30* (2013.01); *H03F 1/301* (2013.01); *H03F 1/302* (2013.01); *H03F 3/19* (2013.01); *H03F 3/21* (2013.01); *H03F 3/245* (2013.01); *H03F 2200/447* (2013.01)

(58) Field of Classification Search
CPC .............. H03F 2200/451; H03F 3/193; H03F 3/45179; H03F 1/0222; H03F 2200/294; H03F 3/45071; H03F 1/0211; H03F 1/0272; H03F 1/223; H03F 1/303; H03F 1/483; H03F 2003/45008

USPC ................. 330/285, 289, 296, 295, 302, 310
See application file for complete search history.

(56) References Cited

U.S. PATENT DOCUMENTS

| 6,492,874 | B1 * | 12/2002 | Shih ............................. 330/288 |
| 7,768,354 | B2 * | 8/2010 | Matsuda et al. .............. 330/299 |
| 7,872,532 | B2 * | 1/2011 | Ishihara et al. ............... 330/289 |
| 8,138,836 | B2 * | 3/2012 | Matsuzuka et al. ........... 330/296 |
| 8,354,888 | B2 * | 1/2013 | Matsuzuka et al. ........... 330/296 |
| 2002/0135423 | A1 * | 9/2002 | Yamashita ..................... 330/285 |
| 2003/0117219 | A1 | 6/2003 | Yamamoto et al. |
| 2004/0232992 | A1 * | 11/2004 | Kuriyama ..................... 330/289 |
| 2007/0096823 | A1 * | 5/2007 | Wang et al. .................... 330/285 |
| 2008/0001661 | A1 | 1/2008 | Tachibana et al. |
| 2009/0072901 | A1 | 3/2009 | Yamanouchi et al. |
| 2009/0256637 | A1 | 10/2009 | Ishihara et al. |

FOREIGN PATENT DOCUMENTS

| JP | 5-175747 A | 7/1993 |
| JP | 11-330866 A | 11/1999 |
| JP | 2003-174335 A | 6/2003 |
| JP | 2008-3727 A | 1/2008 |
| JP | 2009-253918 A | 10/2009 |
| WO | 2007/123040 A1 | 11/2007 |

\* cited by examiner

*Primary Examiner* — Khanh V Nguyen

(74) *Attorney, Agent, or Firm* — Keating & Bennett, LLP

(57) ABSTRACT

A power amplifying module includes a radio frequency amplifying circuit including an amplifying circuit configured to amplify an input signal and output an amplified signal, and a bias circuit of an emitter-follower type configured to bias the amplifying circuit to an operating point, and a constant voltage generating circuit configured to generate, from a first reference voltage, a first constant voltage applied to a base side of a transistor of the bias circuit and a second constant voltage applied to a collector side of the transistor.

28 Claims, 21 Drawing Sheets

POWER AMPLIFYING MODULE

This application is based upon and claims the benefit of priority from Japanese patent application No. 2013-042908, filed on Mar. 5, 2013, the disclosure of which is incorporated herein in its entirety by reference.

BACKGROUND OF THE INVENTION

1. Field of the Invention

The present invention relates to a power amplifying module.

2. Description of the Related Art

A mobile communication device such as a mobile phone uses a power amplifying module to amplify the power of a radio frequency (RF) signal to be transmitted to a base station. Such a power amplifying module includes, in addition to an amplifying circuit that amplifies an RF signal, a bias circuit for biasing a transistor forming the amplifying circuit to an operating point. See, for example, Patent Publication JP-A-11-330866.

FIG. 25 is a diagram showing a general configuration of an amplification circuit and a bias circuit. An amplification circuit 2501 amplifies an RF signal ($RF_{IN}$) input to the base thereof and outputs the amplified RF signal ($RF_{OUT}$). A bias circuit 2502 is adapted to bias a transistor 2503 forming the amplification circuit 2501 to an operating point and has an emitter-follower configuration. As shown in FIG. 25, in general, a constant voltage $V_{REF}$ controlled to a predetermined level is often applied to a base side of a transistor 2504 of the bias circuit 2502. On the other hand, a power supply voltage such as a battery voltage $V_{BAT}$ is often applied directly to a collector side of the transistor 2504.

In the mobile communication device such as a mobile phone, high linearity is needed for the power amplifying module in order to increase communication speed. However, the battery voltage $V_{BAT}$ may vary significantly within the range of, for example, a little under 3 V to about 5 V. When such a battery voltage $V_{BAT}$ is applied to the collector side of the transistor 2504, a variation in battery voltage $V_{BAT}$ varies a bias output from the bias circuit 2502. Then, the variation in bias output varies the gain of the amplification circuit 2501, reducing the linearity.

SUMMARY OF THE INVENTION

In view of the above, preferred embodiments of the present invention provide a power amplifying module that increases the linearity of the power amplifying module.

A power amplifying module according to a preferred embodiment of the present invention includes a radio frequency amplifying circuit including an amplifying circuit configured to amplify an input signal and output an amplified signal, and a bias circuit of an emitter-follower type configured to bias the amplifying circuit to an operating point; and a constant voltage generating circuit configured to generate, from a first reference voltage, a first constant voltage applied to a base side of a transistor of the bias circuit and a second constant voltage applied to a collector side of the transistor.

Preferred embodiments of the present invention achieve an increase in the linearity of the power amplifying module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
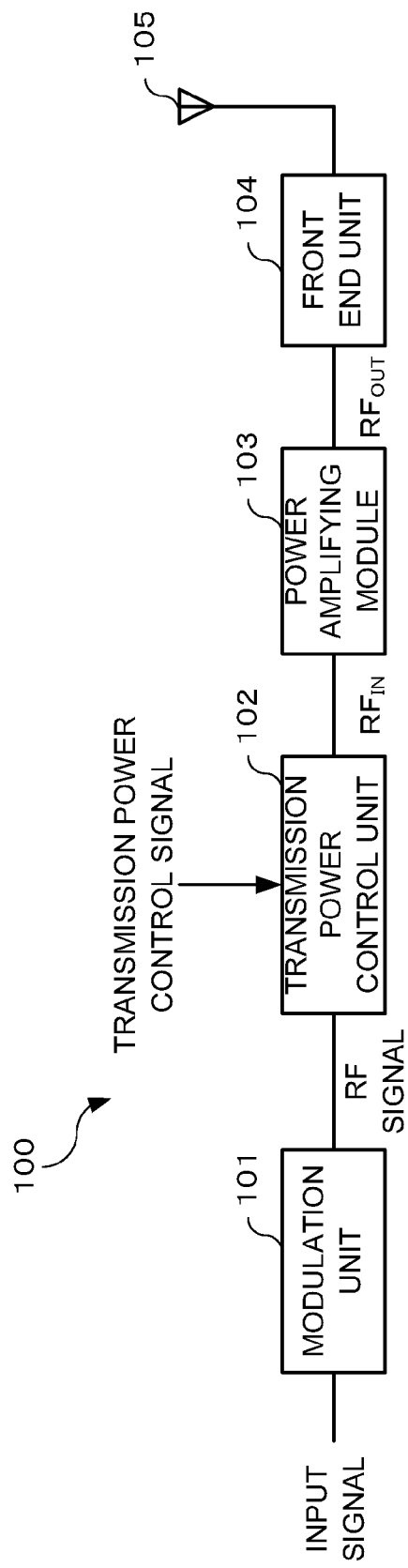
FIG. 1 is a diagram showing an example of a configuration of a transmission unit including a power amplifying module according to a preferred embodiment of the present invention.

Preferred embodiments of the present invention will be described below with reference to the drawings. FIG. 1 is a diagram showing an example of a configuration of a transmission unit including a power amplifying module according to a preferred embodiment of the present invention. A transmission unit 100 is used, for example, in a mobile communication device such as a mobile phone, to transmit various signals such as voice and data to a base station. The mobile communication device also includes a reception unit that receives signals from the base station, but relevant descriptions are omitted.

As shown in FIG. 1, the transmission unit 100 includes a modulation unit 101, a transmission power control unit 102, a power amplifying module 103, a front end unit 104, and an antenna 105.

The modulation unit 101 modifies an input signal based on a modulation scheme such as high speed uplink packet (HSUPA) or long term evolution (LTE) to generate a high frequency (radio frequency (RF)) signal for radio transmission. RF signals are, for example, several hundred MHz to several GHz in frequency.

The transmission power control unit 102 adjusts the power of an RF signal based on a transmission power control signal to output the adjusted RF signal. The transmission power control signal is generated, for example, based on an adaptive power control (APC) signal transmitted by a base station. For example, by measuring a reception signal from a mobile communication device, the base station transmits the APC signal to the mobile communication device as a command to adjust transmission power in the mobile communication device to an appropriate level.

The power amplifying module 103 amplifies the power of the RF signal ($RF_{IN}$) output by the transmission power control unit 102 to a level needed for transmission to the base station. The power amplifying module 103 thus outputs an amplified signal ($RF_{OUT}$).

The front end unit 104 carries out filtering on the amplified signal, switching to a reception signal received from the base station, and the like. The amplified signal output by the front end unit 104 is transmitted to the base station via the antenna 105.

Figure 2:
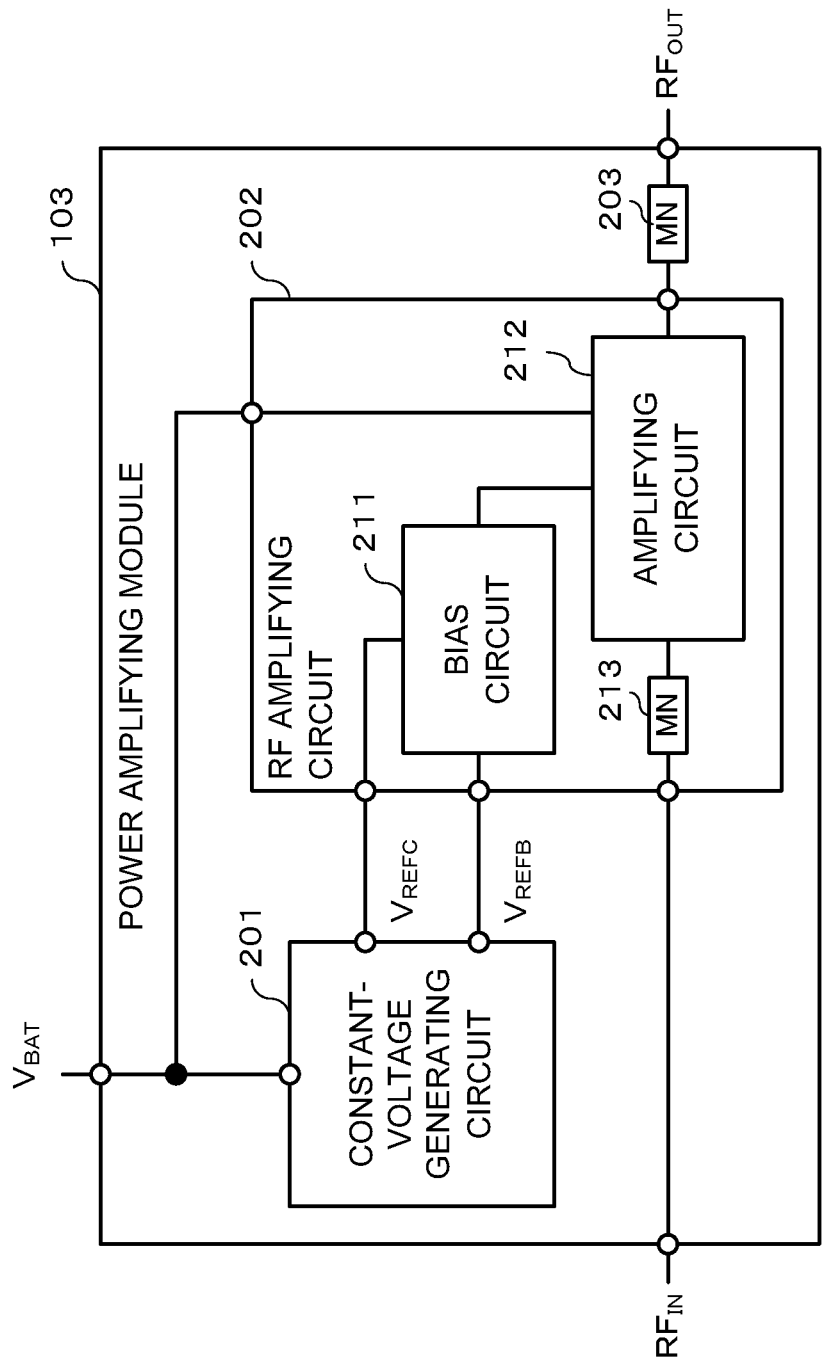
FIG. 2 is a diagram showing an example of a configuration of the power amplifying module according to a preferred embodiment of the present invention.

FIG. 2 is a diagram showing an example of a configuration of the power amplifying module 103. As shown in FIG. 2, the power amplifying module 103 includes a constant-voltage generating circuit 201, an RF amplifying circuit 202, and a matching network (MN) 203. Furthermore, the RF amplifying circuit 202 includes a bias circuit 211, an amplifying circuit 212, and a matching network 213.

In the configuration shown in FIG. 2, the constant-voltage generating circuit 201 and the RF amplifying circuit 202 are preferably located on different substrates. For example, the constant-voltage generating circuit 201 is configured using a MOS field-effect transistor (MOSFET). The RF amplifying circuit 202 can be configured using a bipolar transistor such as a heterojunction bipolar transistor (HBT). When an HBT is used for the RF amplifying circuit 202, a material for a substrate forming the HBT may be, for example, SiGe, GaAs, InP, or GaN. The constant-voltage generating circuit 201 and the RF amplifying circuit 202 may be located on the same substrate.

The constant-voltage generating circuit 201 generates, from a battery voltage $V_{BAT}$, contact voltages $V_{REFB}$ and $V_{REFC}$ to be supplied to the bias circuit 211.

The bias circuit 211 uses the constant voltages $V_{REFB}$ and $V_{REFC}$ supplied by the constant-voltage generating circuit 201 to bias the transistor of the amplifying circuit 212 to an operating point.

The amplifying circuit 212 amplifies the input RF signal ($RF_{IN}$) and outputs the amplified signal $RF_{OUT}$. The matching networks 213 and 203 respectively provided before and after the amplifying circuit 212 are adapted to match the input impedance of the amplifying circuit 212 with the output impedance of the amplifying circuit 212. The matching networks 213 and 203 preferably include, for example, a capacitor or an inductor.

An example of a configuration of the constant-voltage generating circuit 201 and the RF amplifying circuit 202, which form the power amplifying module 103, will be described.

Figure 3:
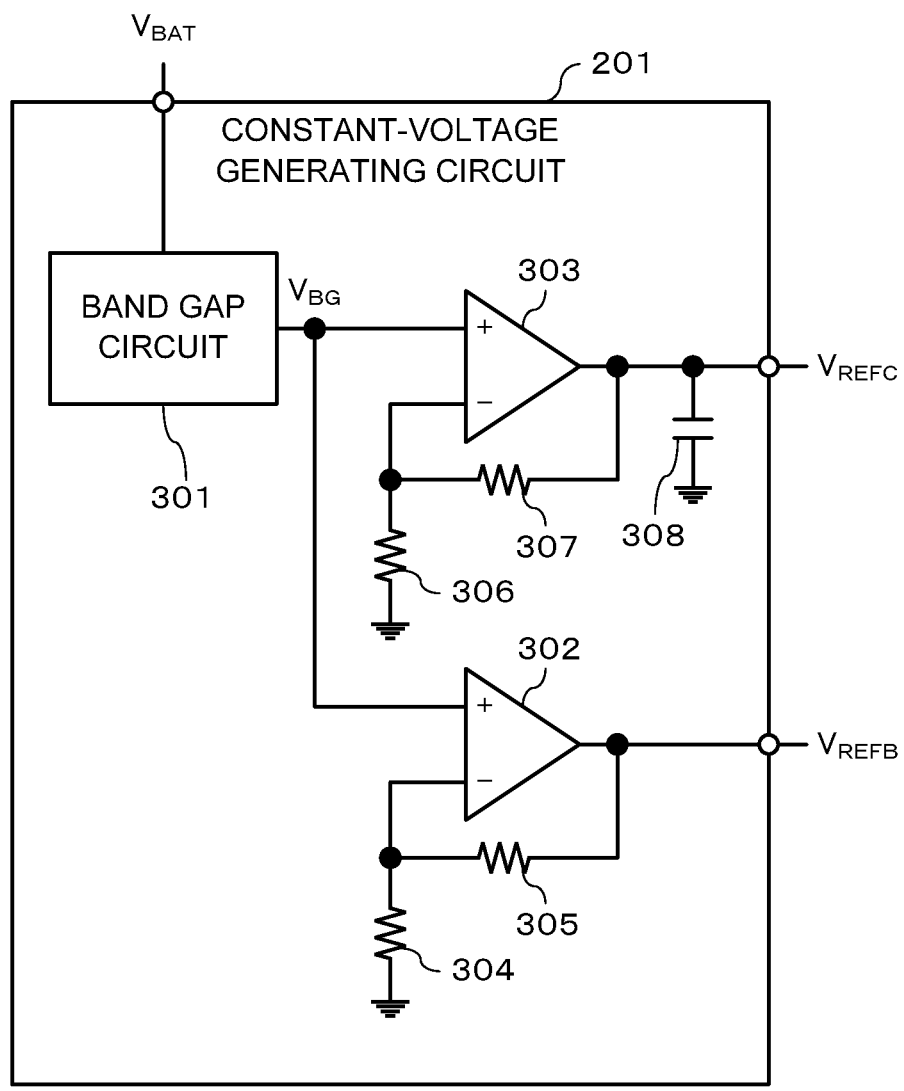
FIG. 3 is a diagram showing an example of a configuration of a constant voltage generating circuit according to a preferred embodiment of the present invention.

FIG. 3 is a diagram showing an example of a configuration of the constant-voltage generating circuit 201. As shown in FIG. 3, the constant-voltage generating circuit 201 may preferably include a band gap circuit 301, operational amplifiers 302 and 303, resistors 304 to 307, and a capacitor 308.

The band gap circuit 301 generates, from the power supply voltage such as the battery voltage $V_{BAT}$, a band gap reference voltage $V_{BG}$ that is not dependent on a variation in temperature or power supply voltage. The reference voltage $V_{BG}$ is, for example, about 1.2 V.

The operational amplifier 302 and the resistors 304 and 305 define a non-inverting amplifying circuit to amplify the reference voltage $V_{BG}$ by a gain that is based on the resistance values of the resistors 304 and 305, thus generating a constant voltage $V_{REFB}$. Similarly, the operational amplifier 303 and the resistors 306 and 307 define a non-inverting amplifying circuit to amplify the reference voltage $V_{BG}$ so as to achieve a gain that is based on the resistance values of the resistors 306 and 307, thus generating a constant voltage $V_{REFC}$.

In this case, the transistors defining the operational amplifiers 302 and 303 may be, for example, MOSFETs. The transistors defining the operational amplifiers 302 and 303 may be bipolar transistors, for example.

The capacitor 308 is a decoupling capacitor that significantly reduces or prevents the adverse effects of a current returning from the RF amplifying circuit 202.

Figure 4:
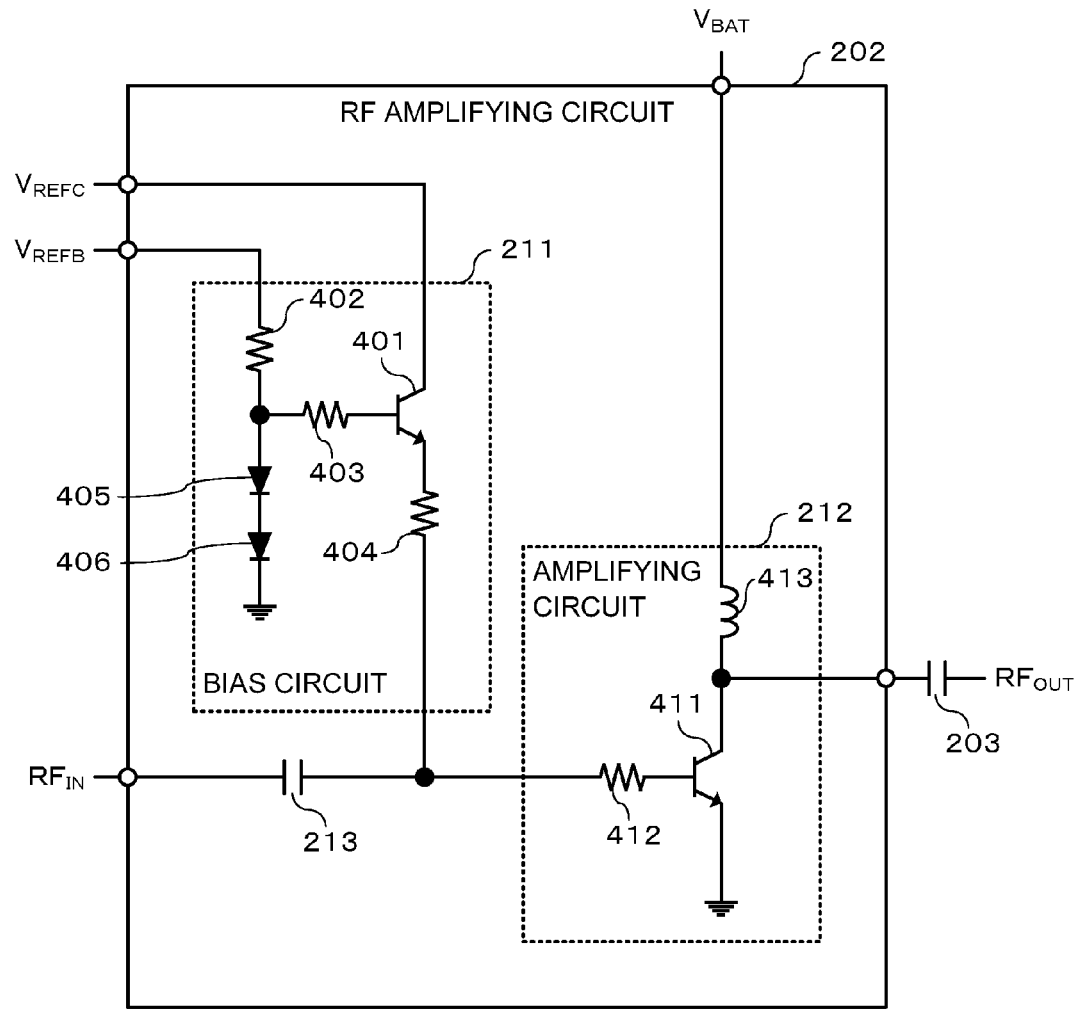
FIG. 4 is a diagram showing an example of a configuration of an RF amplifying circuit according to a preferred embodiment of the present invention.

FIG. 4 is a diagram showing an example of a configuration of the RF amplifying circuit 202. As described above, the RF amplifying circuit 202 includes the bias circuit 211, the amplifying circuit 212, and the matching network 213.

The bias circuit 211 may include a transistor 401, resistors 402 to 404, and diodes 405 and 406. In this case, the transistor 401 preferably is a bipolar transistor such as an HBT. As shown in FIG. 4, the constant voltage $V_{REFB}$ and the constant voltage $V_{REFC}$ supplied by the constant-voltage generating circuit 201 are applied to a base side and a collector side, respectively, of the transistor 401.

Specifically, the constant voltage $V_{REFB}$ is applied to a first end of the resistor 402. A second end of the resistor 402 is connected to the diodes 405 and 406 connected together in series and to a first end of the resistor 403. A second end of the resistor 403 is connected to a base of the transistor 401. Furthermore, the constant voltage $V_{REFC}$ is applied to a collector of the transistor 401. An emitter of the transistor 401 is connected to a first end of the resistor 404. A second end of the resistor 404 is connected to the amplifying circuit 212 as a bias output to the amplifying circuit 212.

The amplifying circuit 212 may include a transistor 411, a resistor 412, and an inductor 413. In this case, the transistor 411 preferably is a bipolar transistor such as an HBT.

As shown in FIG. 4, the RF signal ($RF_{IN}$) is input to a first end of the resistor 412 via the matching network 213 and the resistor 412. The bias output from the bias circuit 211 is connected to the first end of the resistor 412. A second end of the resistor 412 is connected to a base of the transistor 411. Furthermore, the battery voltage $V_{BAT}$ is applied to a first end of the inductor 413. A second end of the inductor 413 is connected to a collector of the transistor 411. The amplified signal $RF_{OUT}$ is output from the collector of the transistor 411 via the matching network 203. The voltage applied to the first end of the inductor 413 may be, instead of the battery voltage $V_{BAT}$, a power supply voltage $V_{CC}$ of a predetermined level generated by a DC/DC converter.

As shown in FIG. 4, in the bias circuit 211, the constant voltage $V_{REFB}$ is applied to the base side of the transistor 401, and the constant voltage $V_{REFC}$ is applied to the collector side of the transistor 401. The constant voltage $V_{REFC}$ is inhibited from changing in spite of a variation in battery voltage $V_{BAT}$ and thus allows a variation in the bias output from the bias circuit 211 to be significantly reduced compared to battery voltage $V_{BAT}$ applied to the collector side of the transistor 401. Thus, a possible variation in gain of the amplifying circuit 212 is prevented, allowing the linearity of the power amplifying module 103 to be improved.

Furthermore, in the configuration shown in FIG. 4, the battery voltage $V_{BAT}$ is not applied to the collector side of the transistor 401. Thus, the amplifying circuit 212 has a high output level, and thus, when a large current flows through the collector of the transistor 401, the current is prevented from returning to the constant-voltage generating circuit 201. This achieves a reduction in the decoupling capacitance between the constant-voltage generating circuit 201 and the RF amplifying circuit 202. Therefore, as shown in FIG. 3, the capacitor 308, which provides the decoupling capacitance, is built into a chip for the constant-voltage generating circuit 201.

Figure 5:
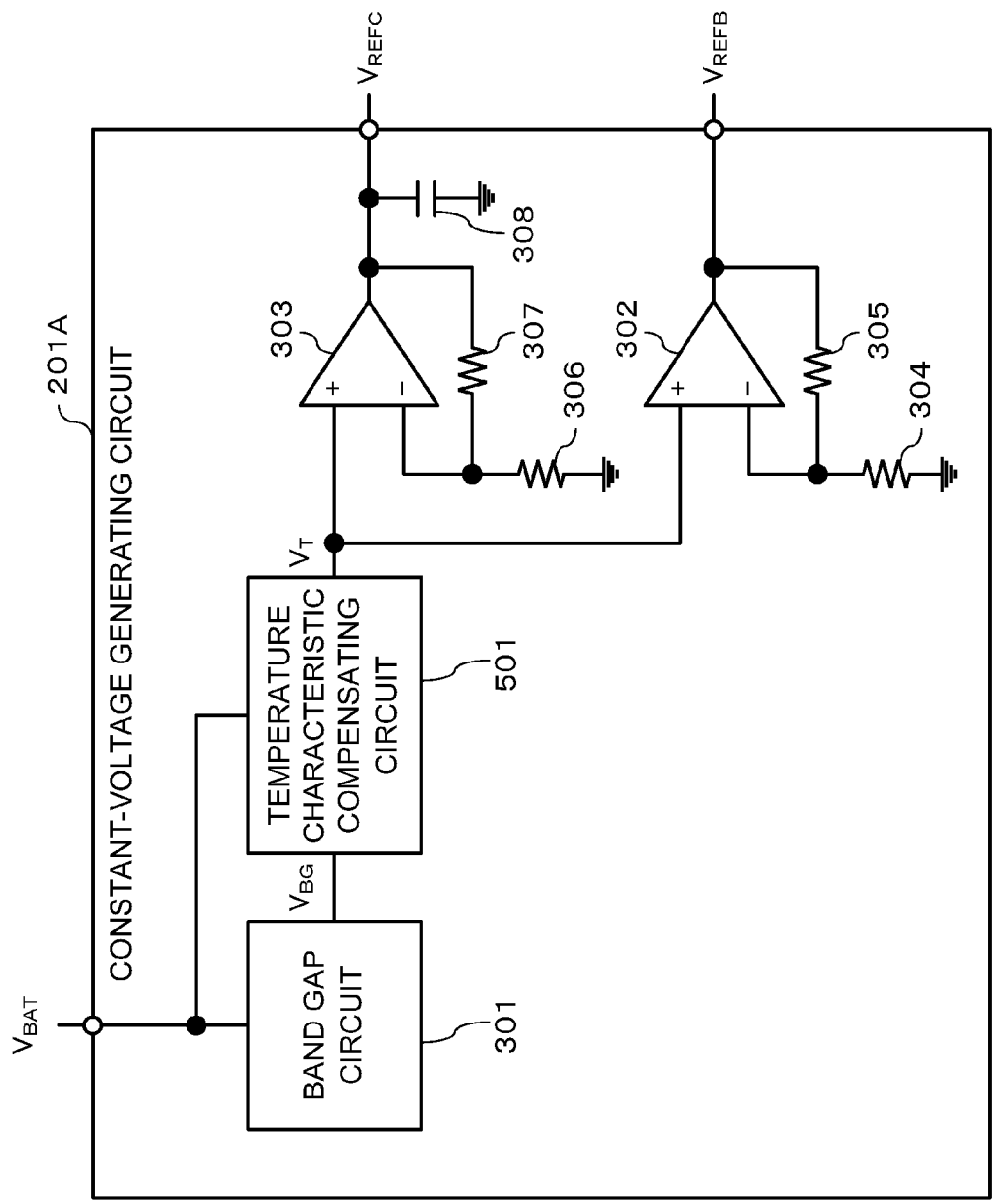
FIG. 5 is a diagram showing another example of a constant voltage generating circuit according to a preferred embodiment of the present invention.

FIG. 5 is a diagram showing another example of a configuration of the constant-voltage generating circuit 201. Components in FIG. 5 which are equivalent to corresponding components of the configuration shown in FIG. 3 are denoted by the same reference numerals and will not be described below. As shown in FIG. 5, a constant-voltage generating circuit 201A may include a temperature characteristic compensating circuit 501 in addition to the components shown in FIG. 3.

The temperature characteristic compensating circuit 501 is a circuit that significantly reduces or prevents a change in bias output from the bias circuit 211 caused by temperature. When the bias circuit 211 is configured as shown in FIG. 4, the bias output is affected by the temperature characteristic of the forward voltage across the diodes 405 and 406. Specifically, when, at low temperatures, the forward voltage across the diodes 405 and 406 rises, if the voltage $V_{REFB}$ is fixed, a base current through the transistor 401 decreases. As a result, a bias current output by the bias circuit 211 also decreases.

Figure 6:
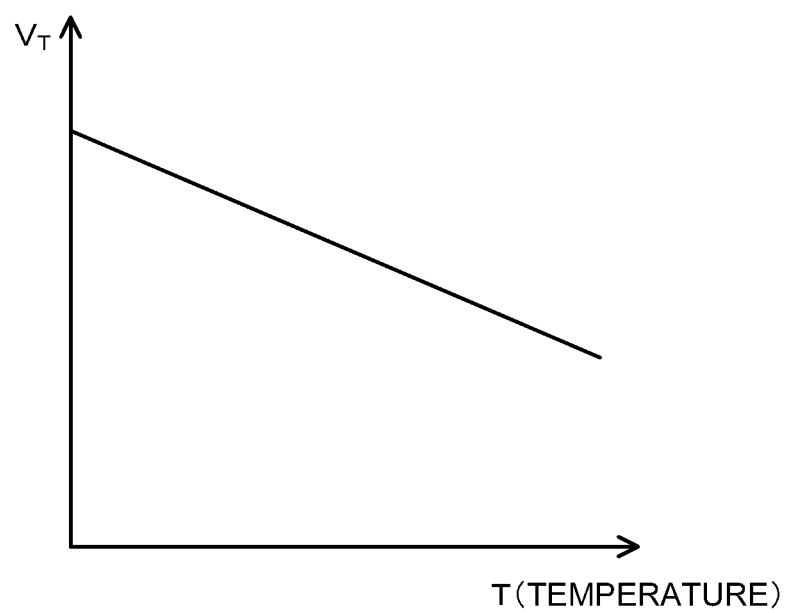
FIG. 6 is a diagram showing an example of a relation between a temperature T and a voltage $V_T$.

Thus, the temperature characteristic compensating circuit 501 generates a reference voltage $V_T$ that changes according to the temperature characteristic of the forward voltage across the diodes 405 and 406. FIG. 6 is a diagram showing an example of a relation between a temperature T and the reference voltage $V_T$. In FIG. 6, the relation between the temperature T and the reference voltage $V_T$ is expressed by a straight line. However, the relation between the temperature T and the reference voltage $V_T$ is not limited to the straight line and may be expressed by, for example, a curve.

Figure 7:
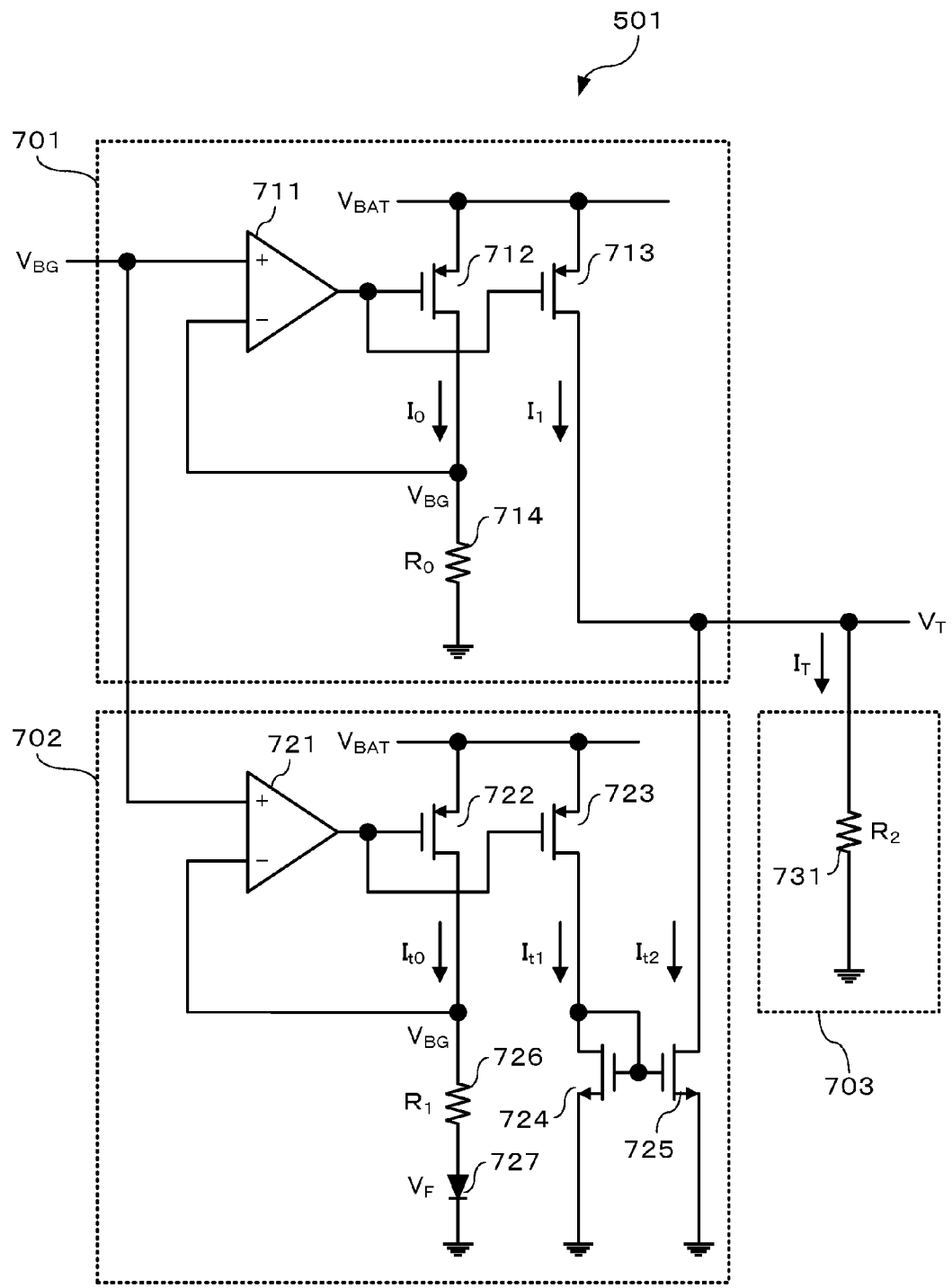
FIG. 7 is a diagram showing an example of a configuration of a temperature characteristic compensating circuit according to a preferred embodiment of the present invention.

FIG. 7 is a diagram showing an example of a configuration of the temperature characteristic compensating circuit 501. As shown in FIG. 7, the temperature characteristic compensating circuit 501 may include a constant-current generating circuit 701, an adjustment current generating circuit 702, and a current-voltage conversion circuit 703. The constant-current generating circuit 701 is a circuit that generates a current that is constant regardless of temperature. The adjustment current generating circuit 702 is a circuit that generates an adjustment current that changes according to temperature. The current-voltage conversion circuit 703 is a circuit that converts a current $I_T$ changing according to both the constant current generated by the constant-current generating circuit 701 and the adjustment current generated by the adjustment current generating circuit 702, into the voltage $V_T$.

As shown in FIG. 7, the constant-current generating circuit 701 includes an operational amplifier 711, transistors (P-type MOS transistor) 712 and 713, and a resistor 714. The operational amplifier 711 includes a non-inverting input terminal to which the band gap reference voltage $V_{BG}$ is applied, an inverting input terminal connected to a connection point between the transistor 712 and the resistor 714, and an output terminal connected to gates of the transistors 712 and 713.

Furthermore, the adjustment current generating circuit 702 includes an operational amplifier 721, transistors (P-type MOS transistors) 722 and 723, transistors (N type MOS transistors) 724 and 725, a resistor 726, and a diode 727. The operational amplifier 721 includes a non-inverting input terminal to which the band gap reference voltage $V_{BG}$ is applied, an inverting input terminal connected to a connection point between the transistor 722 and the resistor 726, and an output terminal connected to gates of the transistors 722 and 723. The transistor 724 is diode-connected in series with the transistor 723 and connected to the transistor 725 in a current mirror manner. A drain of the transistor 725 is connected to a drain of the transistor 713 in the constant-current generating circuit 701. The resistor 726 is connected to a drain of the transistor 722 at a first end thereof and grounded at a second end thereof via a diode 727. The temperature characteristic of the diode 727 is equivalent to the temperature characteristic of the diodes 405 and 406.

The current-voltage conversion circuit 703 includes a resistor 731. The resistor 731 is connected at a first end thereof to the drain of the transistor 713 in the constant-current generating circuit 701 and to the drain of the transistor 725 in the adjustment current generating circuit 702 and is grounded at a second end thereof.

In the configuration shown in FIG. 7, when the resistance value of the resistor 714 is denoted by $R_0$, a current $I_0$ flowing through the transistor 712 is $V_{BG}/R_0$ (constant current). A current $I_1$ flowing through the transistor 713 is $k_1 \times I_0$ (constant current). A coefficient according to the size ratio between the transistors 712 and 713 is denoted by $k_1$.

Furthermore, when the resistance value of the resistor 726 is denoted by $R_1$ and the forward voltage across the diode 727 is denoted by $V_F$, a current $I_{t0}$ flowing through the transistor 722 is $(V_{BG}-V_F)/R_1$. A current $I_{t1}$ flowing through the transistor 723 is $k_2 \times I_{t0}$. A coefficient according to the size ratio between the transistors 722 and 723 is denoted by $k_2$. Moreover, a current flowing through the transistor 725 is expressed by $I_{t2}=k_3 \times I_{t1}$. A coefficient according to the size ratio between the transistors 724 and 725 is denoted by $k_3$. Here, $V_F$ changes according to temperature, and thus, the currents $I_{t0}$ to $I_{t2}$ also change according to temperature.

Figure 8:
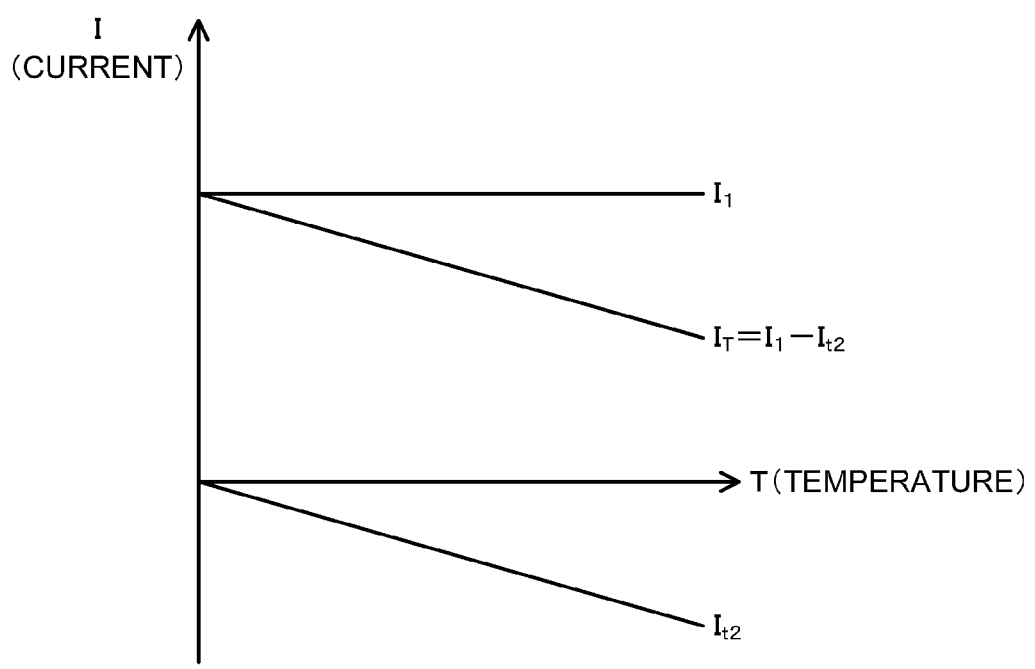
FIG. 8 is a diagram showing an example of a change in current $I_T$.

FIG. 8 is a diagram showing an example of a change in current $I_T$. When the forward voltage $V_F$ across the diode 727 is assumed to decrease with increasing temperature, the current $I_{t2}$ increases with increasing temperature. The current $I_{t2}$ flows in a direction opposite to the direction of the current $I_T$ flowing through the resistor 731, and is thus shown in FIG. 8 to have a negative temperature characteristic. The current $I_T$ flowing through the resistor $R_2$ is equal to the current $I_1$ minus the current $I_{t2}$ and thus decreases with increasing temperature as shown in FIG. 8. Thus, the current $I_T$ as described above is converted into a voltage by the resistor 731, allowing generation of the reference voltage $V_T$ decreasing with increasing temperature as shown in FIG. 6. That is, the reference voltage $V_T$ is generated which changes according to the temperature characteristic of the forward voltage across the diodes 405 and 406.

With reference back to FIG. 5, the constant-voltage generating circuit 201A generates constant voltages $V_{REFB}$ and $V_{REFC}$ based on the thus generated reference voltage $V_T$. Thus, the constant voltage $V_{REFB}$ and $V_{REFC}$ vary according to the temperature characteristic of the forward voltage across the diodes 405 and 406. Hence, even when a change in temperature varies the forward voltage across the diodes 405 and 406, the constant voltage $V_{REFB}$ correspondingly changes. This significantly reduces or prevents a change in the base current through the transistor 401, allowing a variation in bias output to be prevented.

Figure 9:
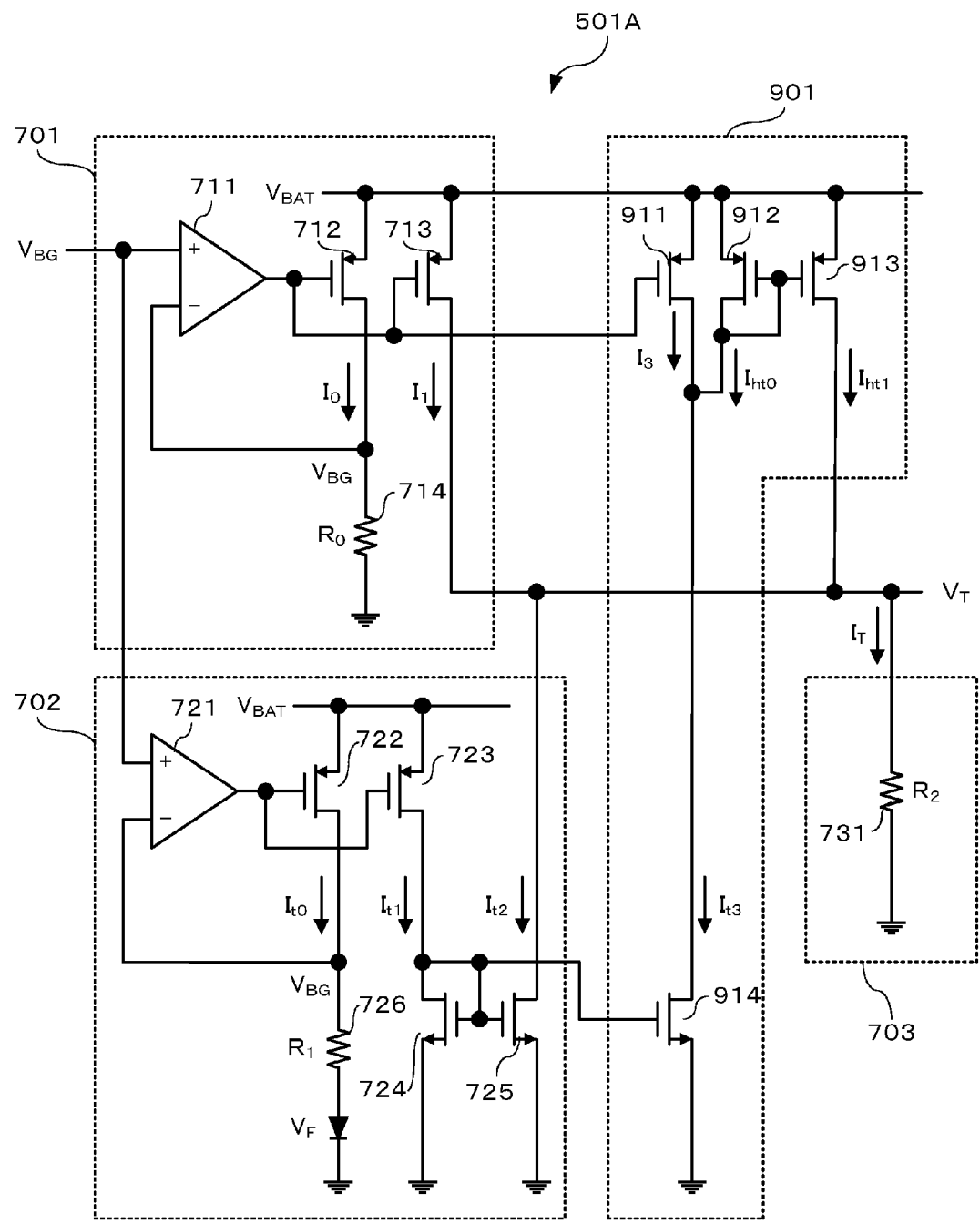
FIG. 9 is a is a diagram showing an example of a configuration of the temperature characteristic compensating circuit provided when the reference voltage $V_T$ is changed in accordance with a second-order change characteristic.

FIG. 7 shows an example of a configuration that varies the reference voltage $V_T$ in accordance with a first-order (linear) change characteristic. However, the change characteristic of the reference voltage $V_T$ may be of a second order or higher, for example. FIG. 9 is a diagram showing an example of a configuration of the temperature characteristic compensating circuit 501 provided when the reference voltage $V_T$ is changed in accordance with the second-order change characteristic. Components in FIG. 9 which are equivalent to corresponding components of the configuration shown in FIG. 7 are denoted by the same reference numerals and will not be described below. As shown in FIG. 9, a temperature characteristic compensating circuit 501A includes a secondary correction circuit 901 in addition to the components shown in FIG. 7.

The secondary correction circuit 901 includes transistors (P-type MOS transistors) 911 to 913 and a transistor 914 (N-type MOS transistor). The transistor 911 is connected to an output terminal of the operational amplifier 711 at a gate thereof and to a drain of the transistor 914 at a drain thereof. The transistor 912 is diode-connected and is connected to the transistor 913 in a current mirror manner. Furthermore, the transistor 912 is connected to the drain of the transistor 911 at a drain thereof. The transistor 913 is connected to a first end of the resistor 731 at a drain thereof. The transistor 914 is connected to the transistor 724 in a current mirror manner.

In the temperature characteristic compensating circuit 501A, a current flowing through the transistor 914 is $I_{t3}=k_4 \times I_{t1}$. A coefficient according to the size ratio between the transistors 724 and 914 is denoted by $k_4$. Furthermore, a current flowing through the transistor 911 is $I_3=k_5 \times I_0$. A coefficient according to the size ratio between the transistors 712 and 911 is denoted by $k_5$. A current flowing through the transistor 912 is $I_{ht0}=I_{t3}-I_3$ ($I_{ht0} \geq 0$). Additionally, a current flowing through the transistor 913 is $I_{ht1}=k_6 \times I_{ht0}$. A coefficient according to the size ratio between the transistors 912 and 913 is denoted by $k_6$.

Figure 10:
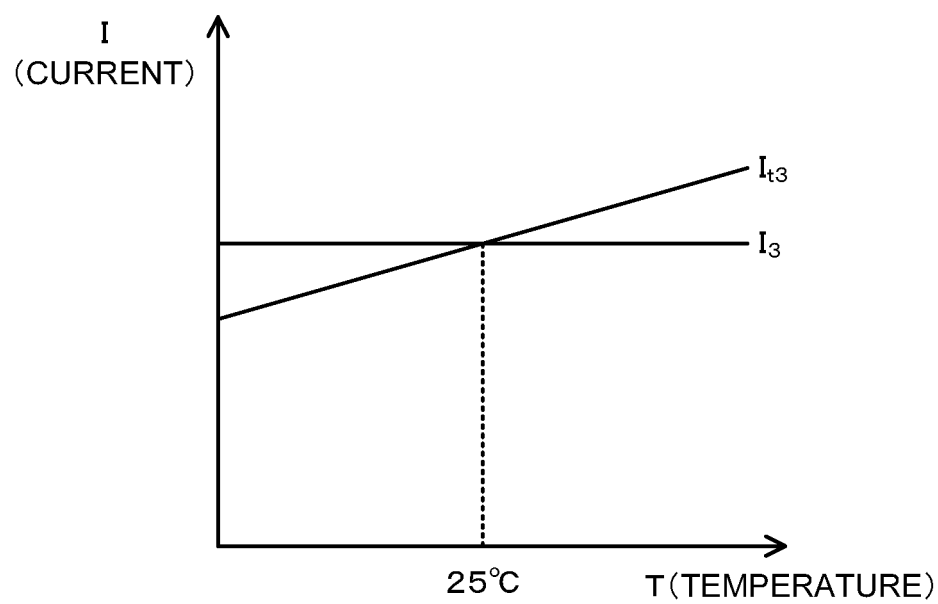
FIG. 10 is a diagram showing an example of a relation between a current $I_{t3}$ and a current $I_3$.
Figure 11:
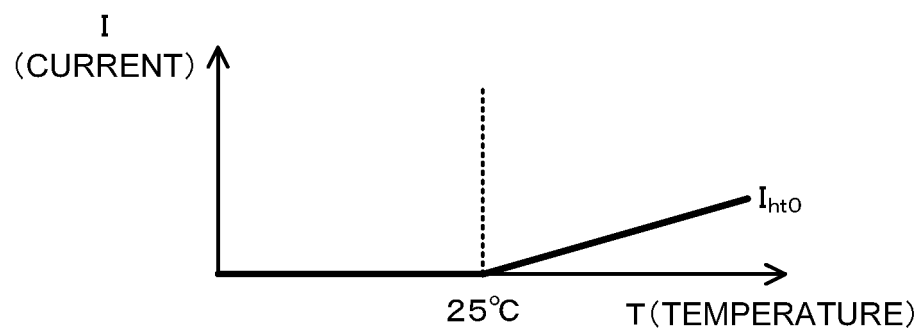
FIG. 11 is a diagram showing an example of a change in current $I_{ht0}$.

FIG. 10 is a diagram showing an example of a relation between a current $I_{t3}$ and a current $I_3$. Furthermore, FIG. 11 is a diagram showing an example of a change in current $I_{ht0}$. In the example shown in FIG. 10, the constant current $I_3$ is set equal to the value of the current $I_{t3}$ measured at about 25° C. If the temperature is lower than 25° C., the constant current $I_3$ is larger than the current $I_{t3}$, and thus, the transistor 911 operates in a saturated region. Thus, no current flows through the transistor 912 ($I_{ht0}=0$). On the other hand, if the temperature is higher than about 25° C., the constant current $I_3$ is smaller than the current $I_{t3}$, and thus, the current $I_{ht0}$, corresponding to the difference between the current $I_3$ and the current $I_{t3}$, flows through the transistor 912. Thus, as shown in FIG. 11, the current $I_{ht0}$ ($=I_{t3}-I_3$) remains zero until the temperature reaches about 25° C., and increases with increasing temperature when the temperature is equal to or higher than about 25° C.

Figure 12:
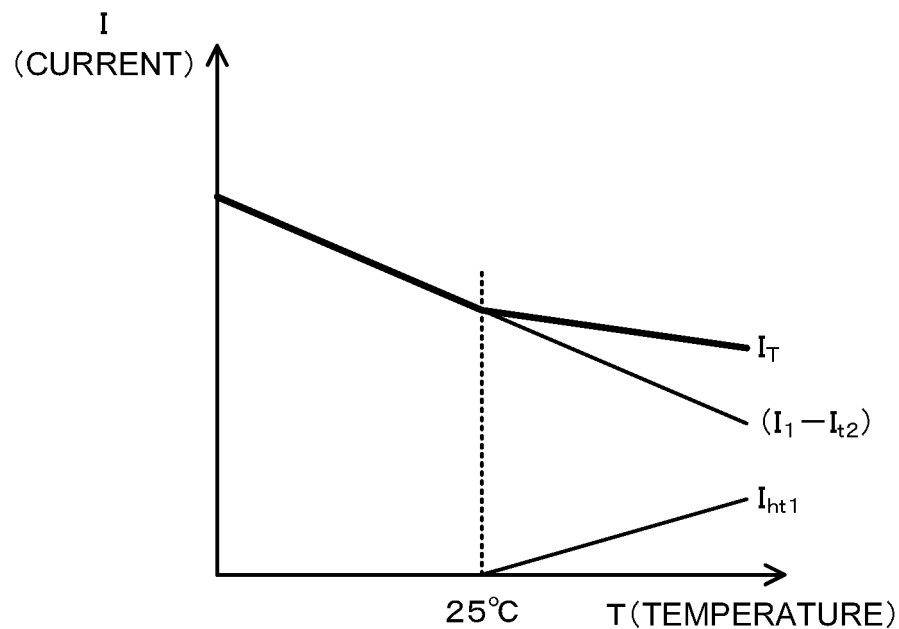
FIG. 12 is a diagram showing an example of a relation between a current $I_{ht1}$ and the current $I_T$.
Figure 13:
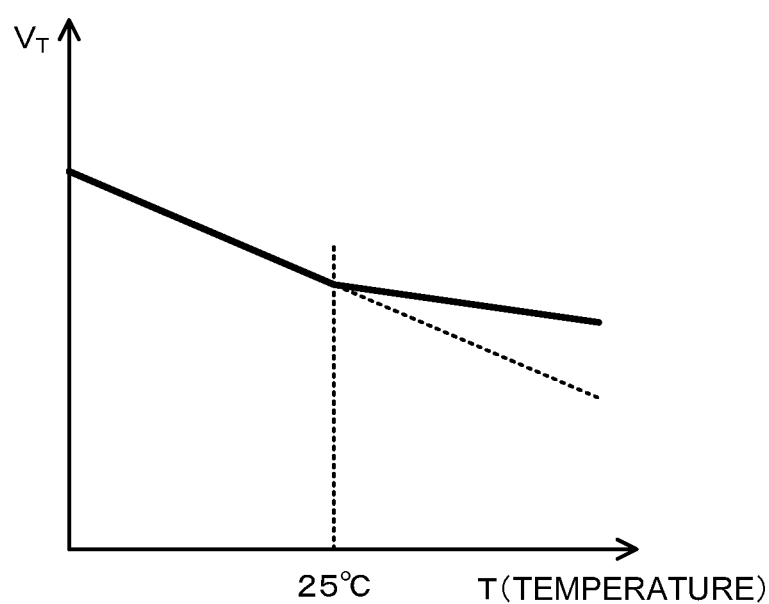
FIG. 13 is a diagram showing an example of the voltage $V_T$ changing in accordance with the second-order change characteristic.

FIG. 12 is a diagram showing an example of a relation between the current $I_{ht1}$ and the current $I_T$. When the current $I_{ht0}$ changes as shown in FIG. 11, the current $I_{ht1}$ similarly changes. Thus, as shown in FIG. 12, the gradient of a line for the current $I_T (=(I_1-I_{t2})+I_{ht1})$ changes at a certain temperature (for example, 25° C.). That is, the current $I_T$ changes in accordance with second-order change characteristic. Thus, the voltage $V_T$, which depends on the current $I_T$, changes in accordance with the second-order change characteristic as shown in FIG. 13. Consequently, the reference voltage $V_{REFB}$ can be more accurately adjusted according to the temperature characteristic of the forward voltage across the diodes 405 and 406.

Figure 14:
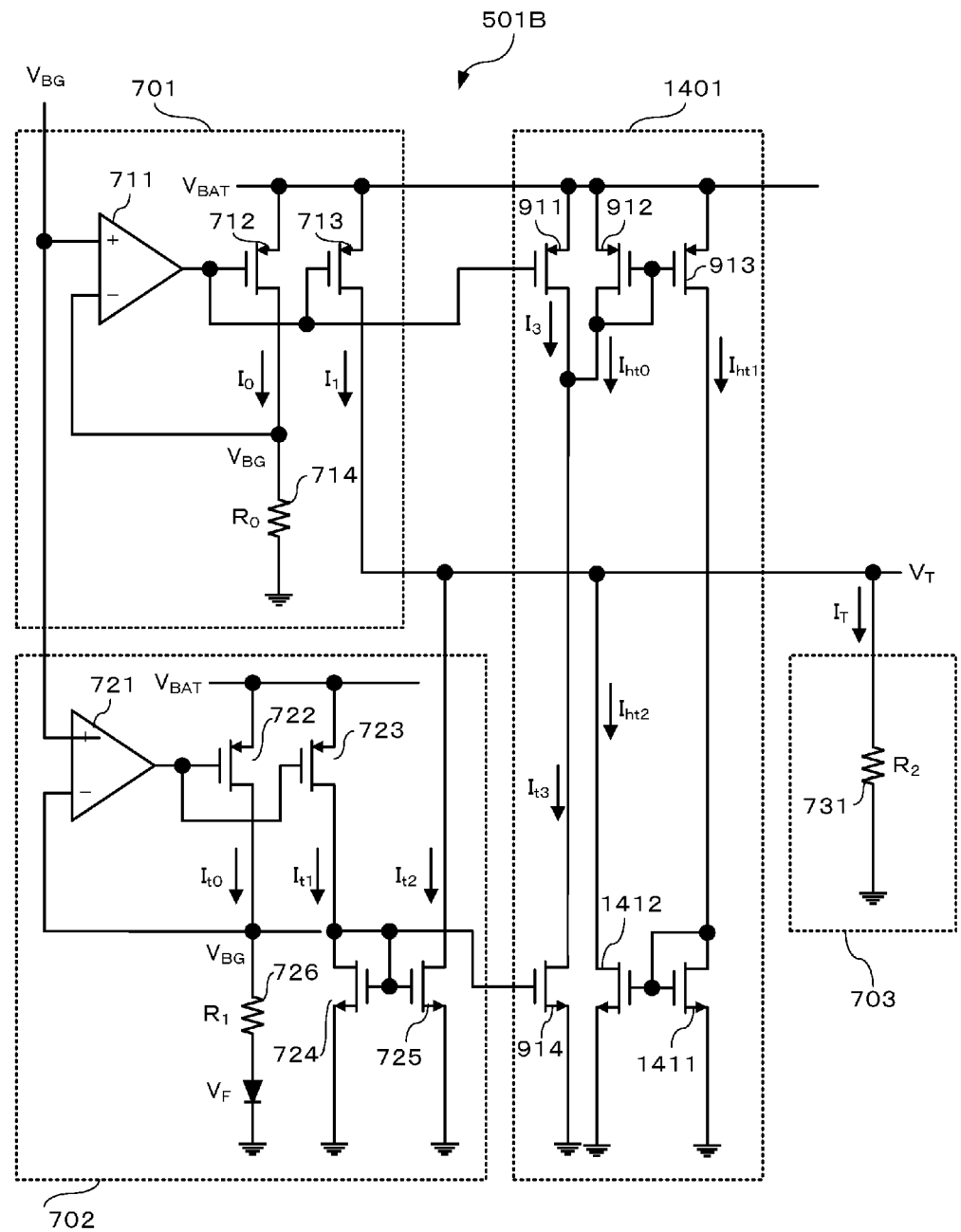
FIG. 14 is a diagram showing another example of a configuration of the temperature characteristic compensating circuit provided when the reference voltage $V_T$ is changed in accordance with the second-order change characteristic.

FIG. 13 shows an example in which the gradient of a line for a change in voltage $V_T$ starts to decrease at a certain temperature. However, the gradient of the line for a change in voltage $V_T$ may start to increase at a certain temperature. FIG. 14 is a diagram showing an example of a configuration of the temperature characteristic compensating circuit 501 provided when the reference voltage $V_T$ is changed in accordance with the second-order change characteristic. Components in FIG. 13 which are equivalent to corresponding components of the configuration shown in FIG. 9 are denoted by the same reference numerals and will not be described below. As shown in FIG. 14, a temperature characteristic compensating circuit 501B includes a secondary correction circuit 1401 instead of the secondary correction circuit 901 shown in FIG. 9.

The secondary correction circuit 1401 includes, in addition to the components of the secondary correction circuit 901, transistors (N-type MOS transistors) 1411 and 1412. The transistor 1411 is diode-connected and is connected to the transistor 1412 in a current mirror manner. The transistor 1411 is connected to the drain of the transistor 913 at a drain thereof. Furthermore, the transistor 1412 is connected to the first end of the resistor 731 at a drain thereof.

Figure 15:
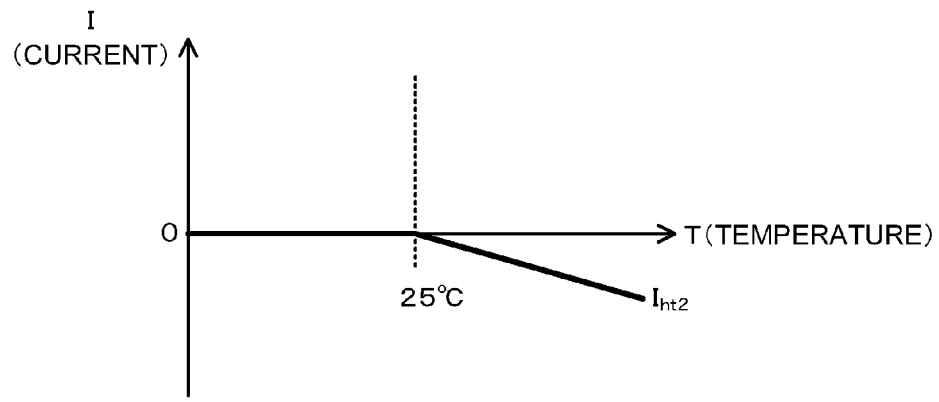
FIG. 15 is a diagram showing an example of a change in current $I_{ht2}$.
Figure 16:
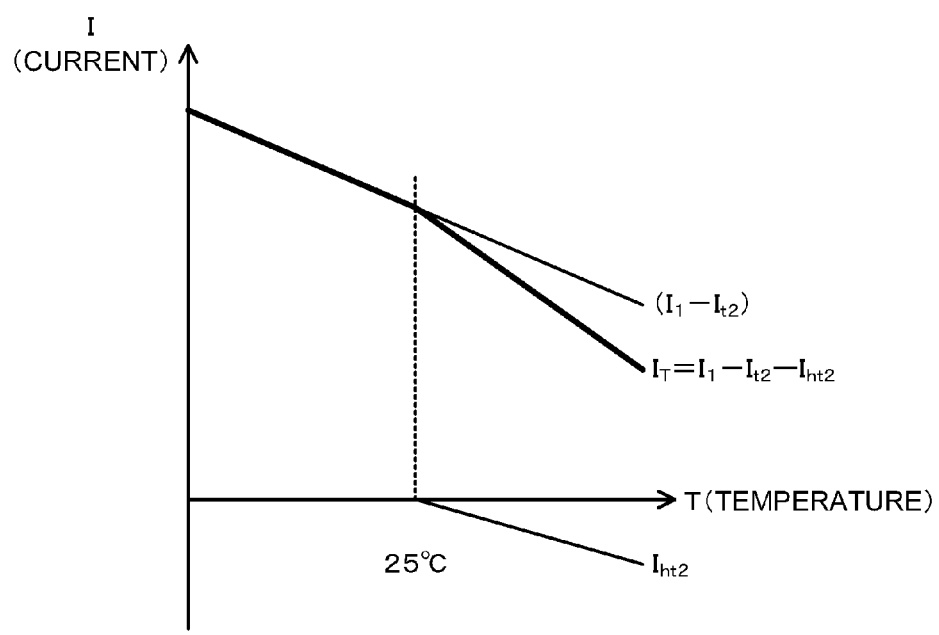
FIG. 16 is a diagram showing an example of a relation between the current $I_{ht1}$ and the current $I_T$.

In the temperature characteristic compensating circuit 501B as described above, a current flowing through the transistor 1412 is $I_{ht2}=k_7 \times I_{ht1}$. A coefficient according to the size ratio between the transistors 1411 and 1412 is denoted by $k_7$. As shown in FIG. 12, the current $I_{ht1}$ remains zero until the temperature reaches a certain value (for example, about 25° C.), and increases with increasing temperature when the temperature is equal to or larger than the certain value (for example, 25° C.). Thus, as shown in FIG. 15, the current $I_{ht2}$ changes similarly to the current $I_{ht1}$. The current $I_{ht2}$ flows in a direction opposite to the direction of the current $I_T$ flowing through the resistor 731, and is thus shown in FIG. 15 to have a negative temperature characteristic. Therefore, as shown in FIG. 16, the gradient of a line for the current $I_T (=I_1-I_{t2})-I_{ht2}$)

starts to increase at a certain temperature (for example 25° C.). The voltage $V_T$ also changes similarly to the current $I_T$.

Figure 17:
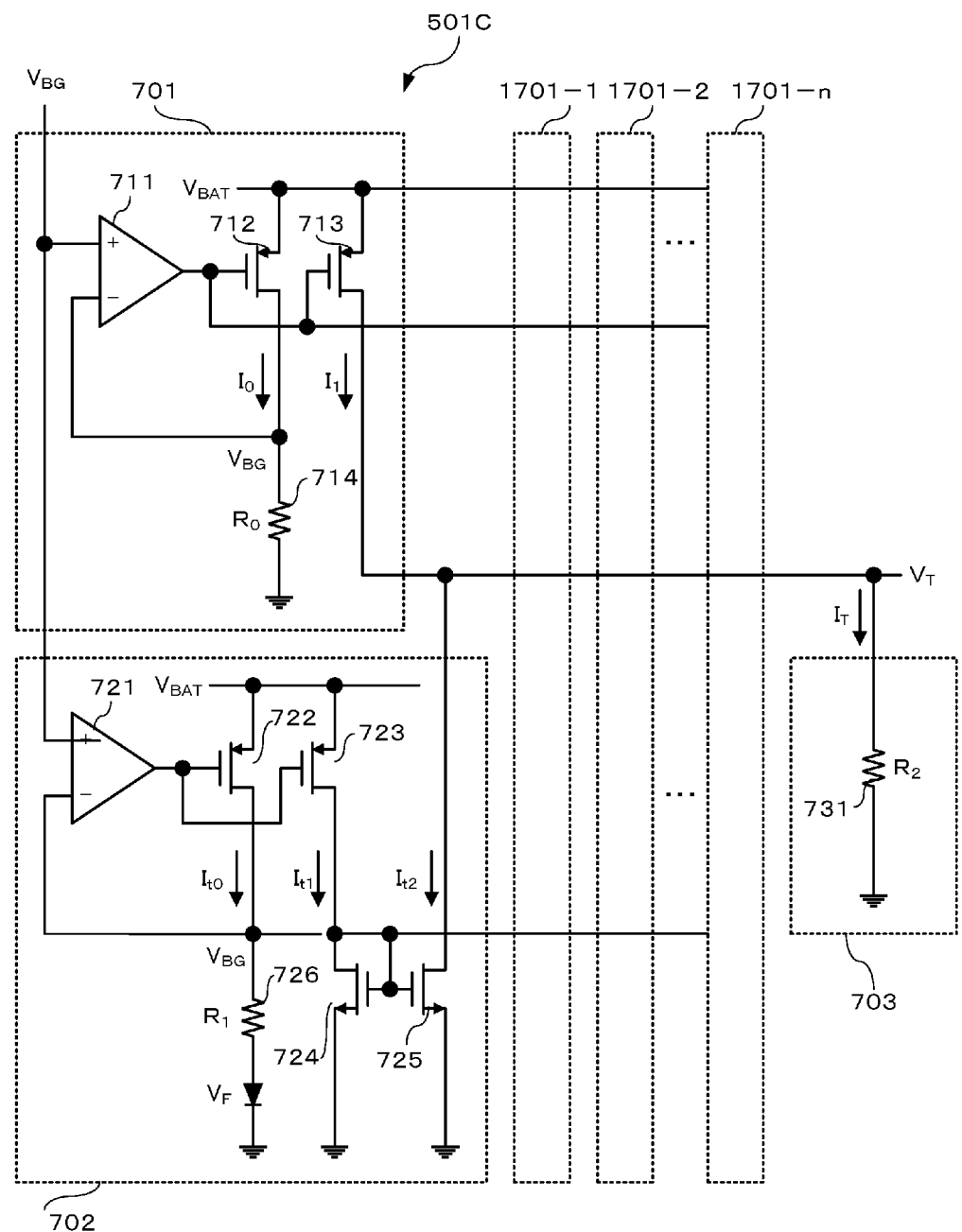
FIG. 17 is a diagram showing another example of a configuration of the temperature characteristic compensating circuit according to a preferred embodiment of the present invention.

Moreover, a combination of a plurality of secondary correction circuits enables the reference voltage $V_T$ to be changed in accordance with a third- or higher-order change characteristic. FIG. 17 is a diagram showing another example of a configuration of the temperature characteristic compensating circuit 501. Components in FIG. 17 which are equivalent to corresponding components of the configuration shown in FIG. 7 are denoted by the same reference numerals and will not be described below. As shown in FIG. 17, a temperature characteristic compensating circuit 501C includes, in addition to the components shown in FIG. 7, n secondary correction circuits 1701-m (m=1 ... n). Each secondary correction circuit 1701-m (m=1 ... n) is configured similarly to the secondary correction circuit 901 shown in FIG. 9 or to the secondary correction circuit 1401 shown in FIG. 14.

Figure 18:
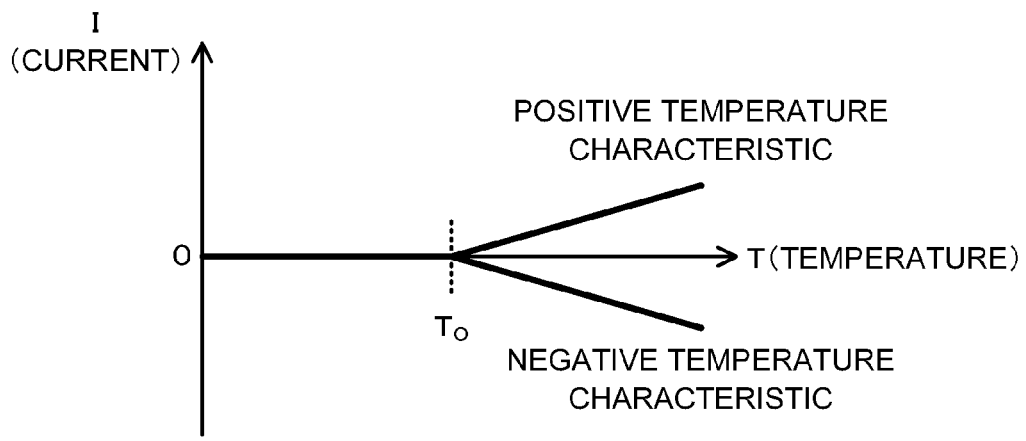
FIG. 18 is a diagram illustrating a positive temperature characteristic and a negative temperature characteristic.

As shown in FIG. 18, a positive temperature characteristic refers to the characteristic that the current $I_T$ starts to increase at a certain temperature ($T_0$) based on the direction of the current $I_T$. A negative temperature characteristic refers to the characteristic that the current $I_T$ starts to decrease at a certain temperature ($T_0$) based on the direction of the current $I_T$. That is, the secondary correction circuit 901 shown in FIG. 9 is a circuit that generates an adjustment current with the positive temperature characteristic. The secondary correction circuit 1401 shown in FIG. 14 is a circuit that generates an adjustment current with the positive temperature characteristic.

Figure 19:
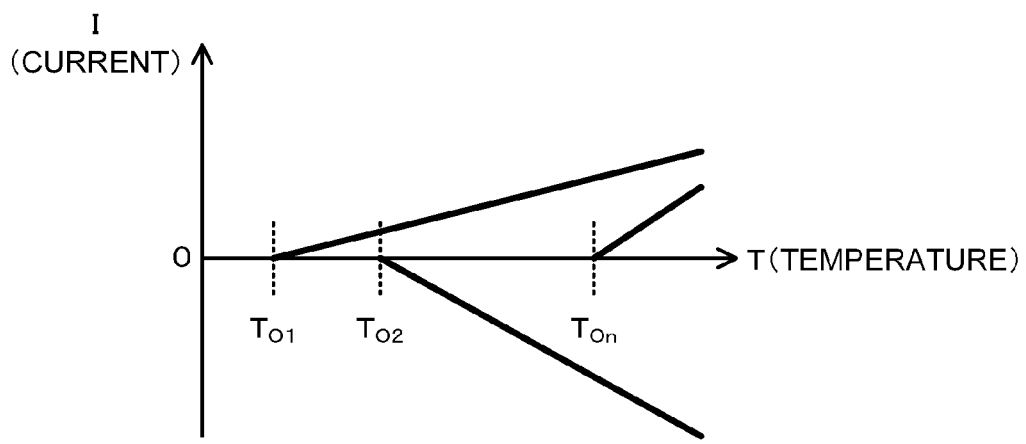
FIG. 19 is a diagram showing an example of the temperature characteristic of a secondary correction circuit according to a preferred embodiment of the present invention.
Figure 20:
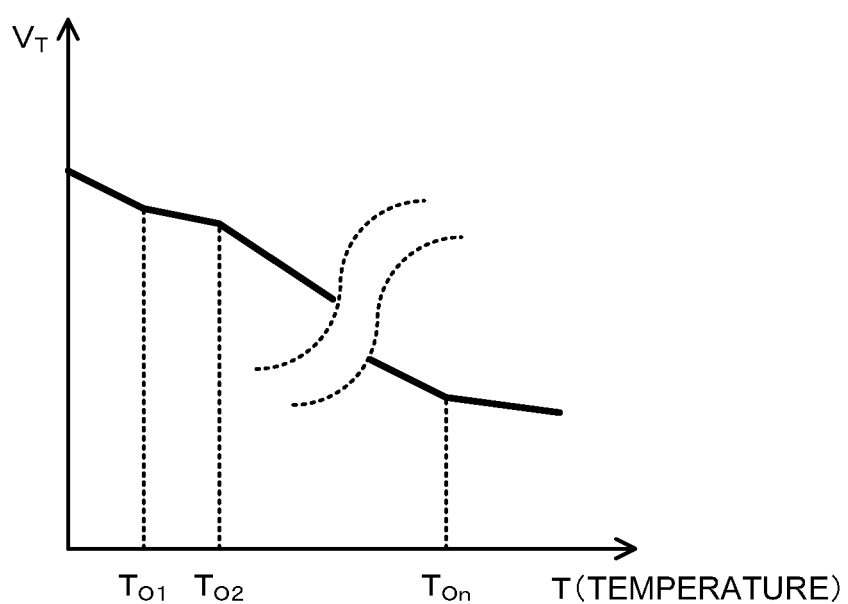
FIG. 20 is a diagram showing an example of the voltage $V_T$ changing in accordance with an nth-order change characteristic.

FIG. 19 is a diagram showing an example of the temperature characteristic of the secondary correction circuit 1701-m (m=1 ... n). As shown in FIG. 19, a temperature $T_{0m}$ (m=1 ... n) at which the current changes and the direction (positive/negative) and gradient of the temperature characteristic are set for each secondary correction circuit 1701-m (m=1 ... n). A combination of such secondary correction circuits 1701-m (m=1 ... n) allows the reference voltage $V_T$ to be changed in accordance with the nth-order change characteristic as shown in FIG. 20. Thus, the reference voltage $V_{REFB}$ is more accurately adjusted according to the temperature characteristic of the forward voltage across the diodes 405 and 406.

Figure 21:
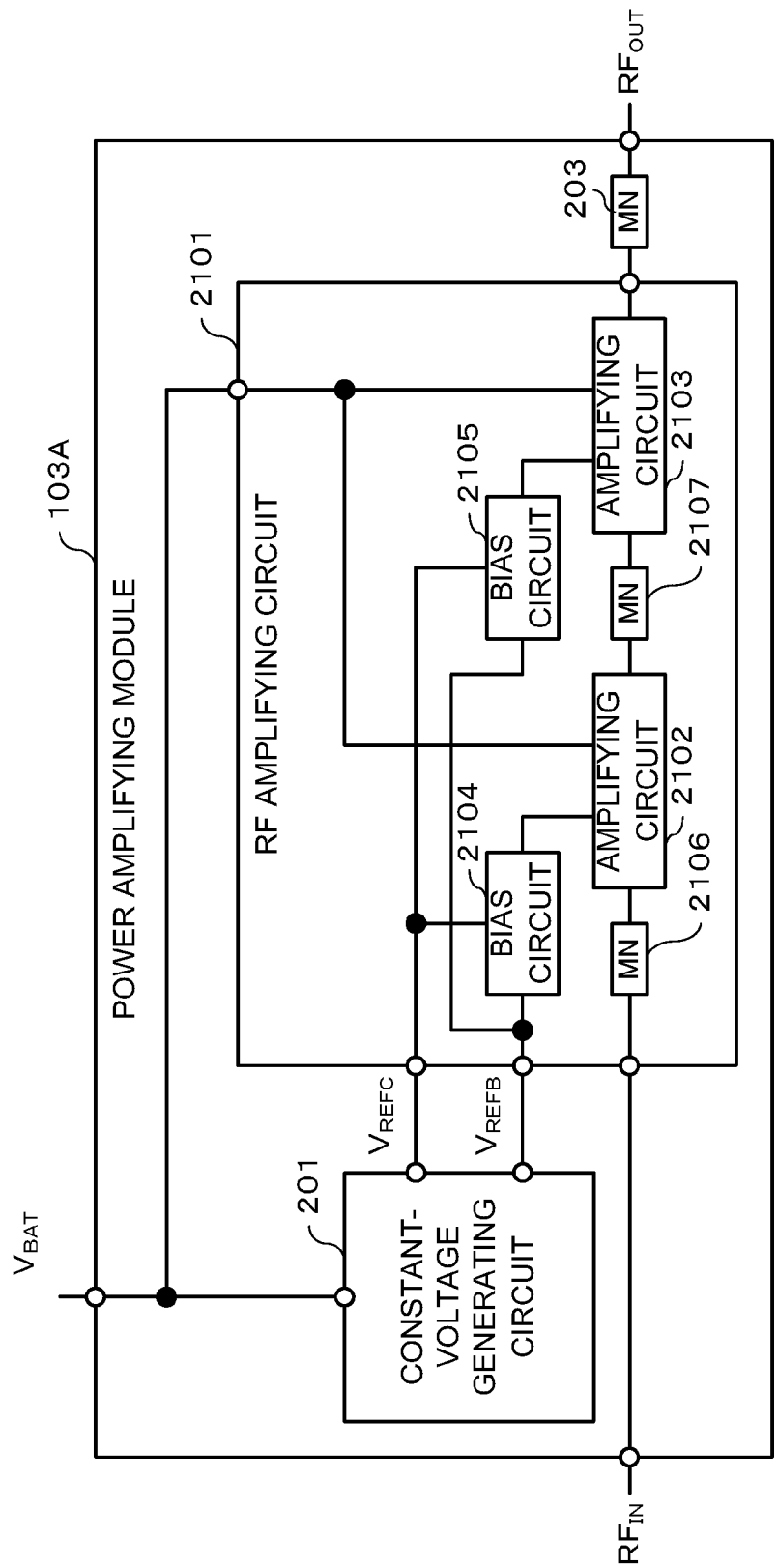
FIG. 21 is a diagram showing an example of a configuration of a power amplifying module with two amplification stages according to a preferred embodiment of the present invention.

FIG. 21 is a diagram showing another example of a configuration of the power amplifying module 103. Components in FIG. 21 which are equivalent to corresponding components of the configuration shown in FIG. 2 are denoted by the same reference numerals and will not be described below. As shown in FIG. 21, a power amplifying module 103A includes an RF amplifying circuit 2101 instead of the RF amplifying circuit 202 in FIG. 2.

The RF amplifying circuit 2101 includes two amplifying circuits 2102 and 2103. Each of the amplifying circuits 2102 and 2103 is configured equivalently to the amplifying circuit 212 shown in FIG. 4. Furthermore, the RF amplifying circuit 2101 includes bias circuits 2104 and 2105 for amplifying circuits 2102 and 2103. Each of the bias circuits 2104 and 2105 is configured equivalently to the bias circuit 211 shown in FIG. 4. The constant voltages $V_{REFB}$ and $V_{REFC}$ are supplied to the bias circuits 2104 and 2105, respectively, as is the case with the bias circuit 211 shown in FIG. 4. Additionally, the RF amplifying circuit 2101 includes matching networks 2106 and 2107 adapted to match the input impedance of the RF amplifying circuit 2101 with the output impedance of the RF amplifying circuit 2101.

As shown in FIG. 21, the amplifying circuit has a two-stage configuration, allowing the gain of the RF amplifying circuit to be increased. An increase in the gain of the RF amplifying circuit increases the adverse effect of a variation in bias output. However, in the configuration shown in FIG. 21, the constant voltages $V_{REFB}$ and $V_{REFC}$ are supplied to the bias circuit 2104 and 2105, thus significantly reducing or preventing a variation in bias output. Thus, possible variations in gains of the amplifying circuits 2102 and 2103 are prevented, allowing the linearity of the power amplifying module 103A to be increased.

Figure 22:
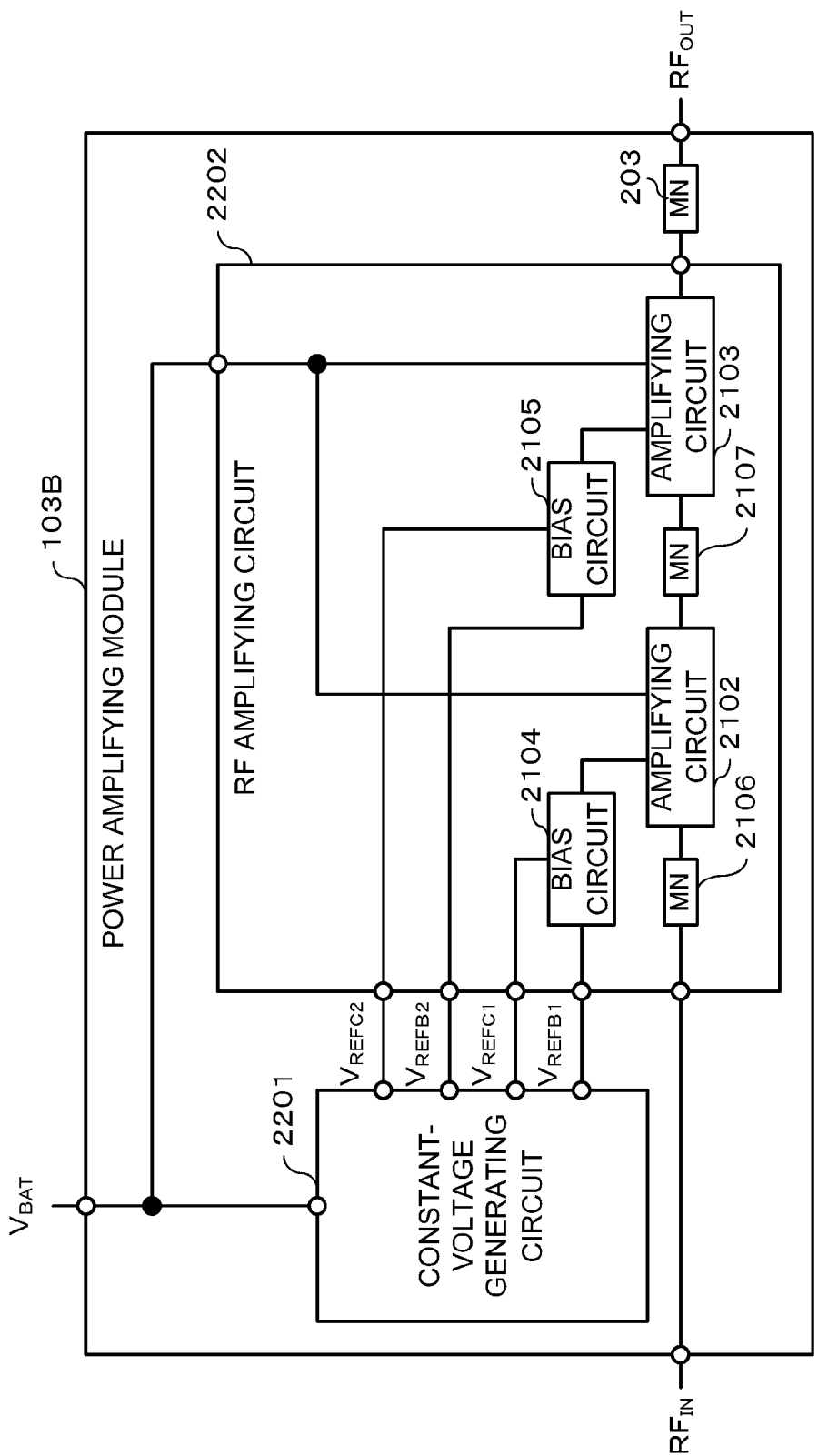
FIG. 22 is a diagram showing an example of a configuration of the power amplifying module with two amplification stages in which constant voltages applied to the respective stages are individually controlled according to a preferred embodiment of the present invention.

FIG. 22 is a diagram showing another example of a configuration of the power amplifying module 103. Components in FIG. 22 which are equivalent to corresponding components of the configuration shown in FIG. 21 are denoted by the same reference numerals and will not be described below. As shown in FIG. 22, a power amplifying module 103B includes a constant-voltage generating circuit 2201 and an RF amplifying circuit 2202 instead of the constant-voltage generating circuit 201 and the RF amplifying circuit 2101 in FIG. 21.

The internal configuration of the RF amplifying circuit 2202 is equivalent to the internal configuration of the RF amplifying circuit 2101 shown in FIG. 21 except that different voltages are supplied to the bias circuit 2104 and 2105. Specifically, a constant voltage $V_{REFB1}$ is applied to a base side of a transistor of the bias circuit 2104. A constant voltage $V_{REFC1}$ is applied to a collector side of the transistor of the bias circuit 2104. Furthermore, a constant voltage $V_{REFB2}$ is applied to a base side of a transistor of the bias circuit 2105. A constant voltage $V_{REFC2}$ is applied to a collector side of the transistor of the bias circuit 2105.

Figure 23:
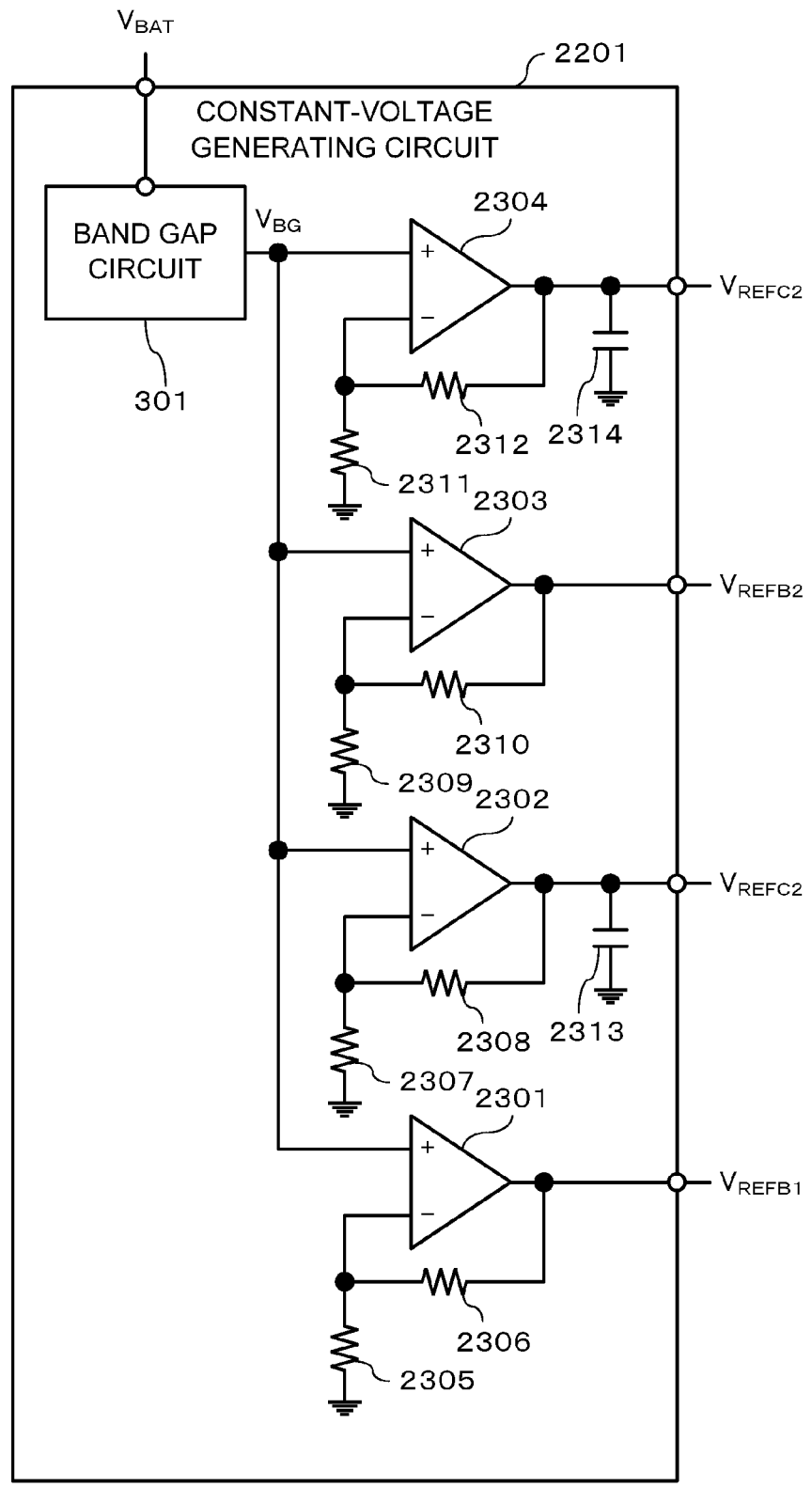
FIG. 23 is a diagram showing an example of a configuration of the constant voltage generating circuit provided when the constant voltages applied to the respective stages are individually controlled according to a preferred embodiment of the present invention.

The constant-voltage generating circuit 2201 generates constant voltages $V_{REFB1}$, $V_{REFC1}$, $V_{REFB2}$, and $V_{REFC2}$ to be supplied to the bias circuits 2104 and 2105. FIG. 23 is a diagram showing an example of a configuration of the constant-voltage generating circuit 2201. As shown in FIG. 23, the constant-voltage generating circuit 2201 includes a band gap circuit 301, operational amplifiers 2301 to 2304, resistors 2305 to 2312, and capacitors 2313 and 2314. The band gap circuit 301 is equivalent to the band gap circuit 301 shown in FIG. 3.

In the configuration shown in FIG. 23, the operational amplifiers 2301 and 2302, the resistors 2305 to 2308, and the capacitor 2313 define a constant-voltage generating circuit that generates the constant voltages $V_{REFB1}$ and $V_{REFC1}$. Furthermore, in the configuration shown in FIG. 23, the operational amplifiers 2303 and 2304, the resistors 2309 to 2312, and the capacitor 2314 define a constant-voltage generating circuit that generates the constant voltages $V_{REFB2}$ and $V_{REFC2}$. An operation of generating the constant voltages $V_{REFB1}$, $V_{REFC1}$, $V_{REFB2}$, and $V_{REFC2}$ is equivalent to the corresponding operation of the constant-voltage generating circuit 201 shown in FIG. 3 and will thus not be described.

By adjusting the resistance values of the resistors 2305 to 2312, the constant-voltage generating circuit 2201 as described above individually generates the constant voltages $V_{REFB1}$ and $V_{REFC1}$, which are suitable for operation of the bias circuit 2104, and the constant voltages $V_{REFB2}$ and $V_{REFC2}$, which are suitable for operation of the bias circuit 2105. That is, the constant voltages $V_{REFB1}$, $V_{REFC1}$, $V_{REFB2}$, and $V_{REFC2}$ are individually controlled in order to supply bias outputs suitable for the amplifying circuits 2102 and 2103, respectively. This allows the flexibility of design of the RF amplifying circuit to be improved. Since the constant voltages are supplied to the bias circuits 2104 and 2105, possible variations in gains of the amplifying circuits 2102 and 2103 are prevented, allowing the linearity of the power amplifying module 103B to be improved.

Figure 24:
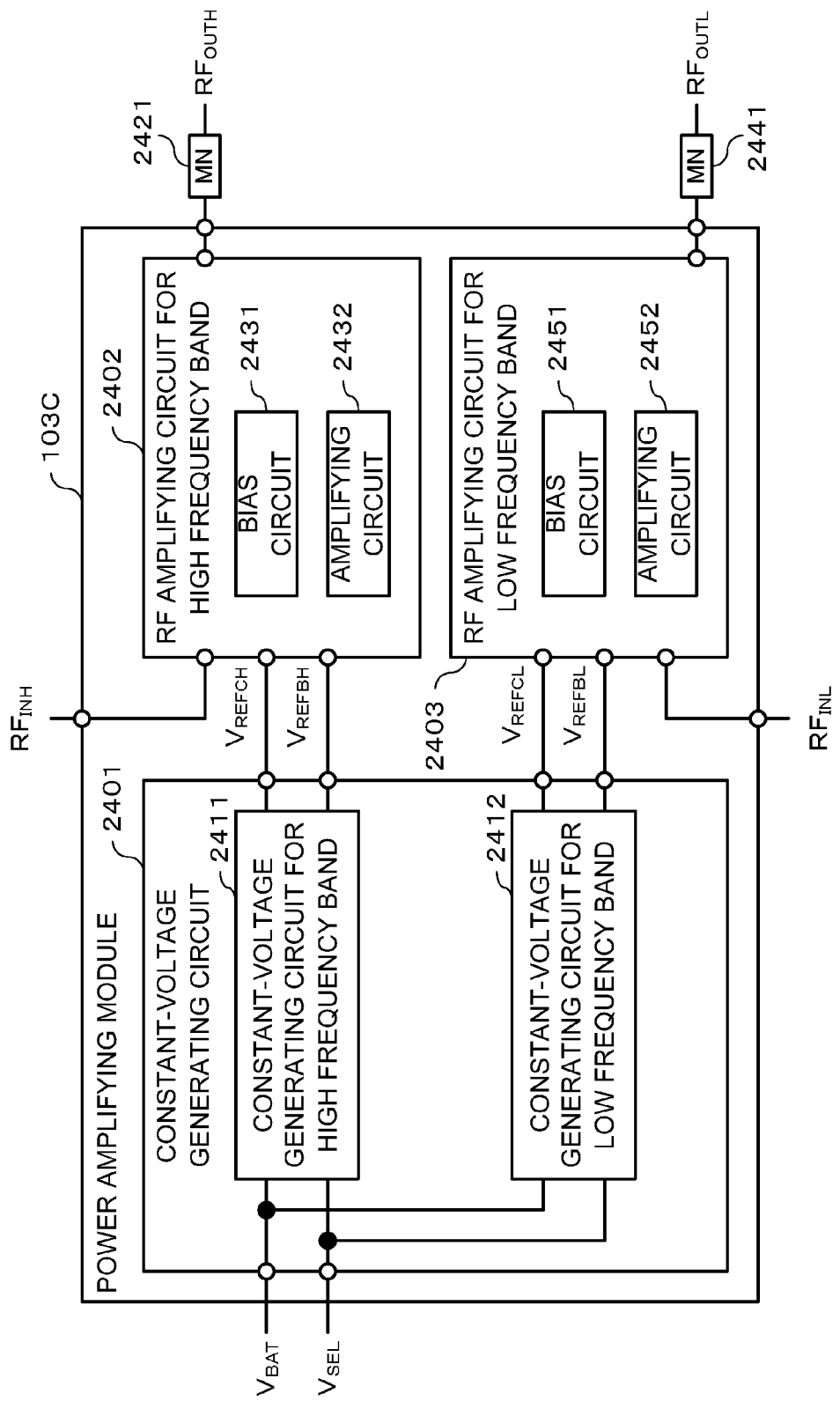
FIG. 24 is a diagram showing an example of a configuration of a power amplifying module adapted for multiple bands according to a preferred embodiment of the present invention.
Figure 25:
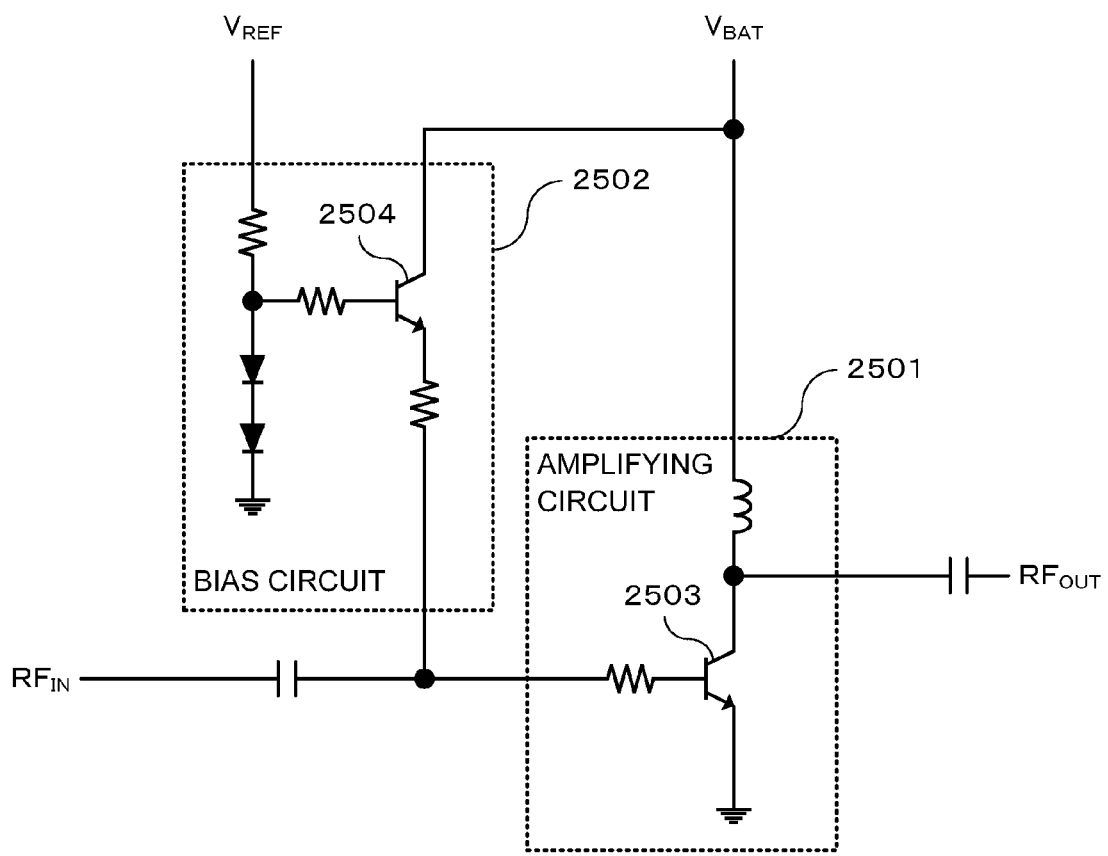
FIG. 25 is a diagram showing a general configuration of an amplification circuit and a bias circuit according to the related art.

FIG. 24 is a diagram showing another example of a configuration of the power amplifying module 103. A power amplifying module 103C is adapted for multiple bands. Specifically, the power amplifying module 103C is adapted for two bands, that is, a high band and a low band. The high band is, for example, a frequency band of about 1.4 GHz or more. The low band is, for example, a frequency band of about 700 MHz or more and less than about 1 GHz.

As shown in FIG. 24, the power amplifying module 103C includes a constant-voltage generating circuit 2401, an RF amplifying circuit for a high frequency band 2402, and an RF amplifying circuit for a low frequency band 2403.

The constant-voltage generating circuit 2401 includes a constant-voltage generating circuit for a high frequency band 2411 and a constant-voltage generating circuit for a low frequency band 2412. The constant-voltage generating circuit for the high frequency band 2411 generates constant voltages $V_{REFBH}$ and $V_{REFCH}$ for the high-frequency RF amplifying circuit 2402. Furthermore, the constant-voltage generating circuit for the low frequency band 2412 generates constant voltages $V_{REFBL}$ and $V_{REFCL}$ for the low-frequency RF amplifying circuit 2403.

A selection signal $V_{SEL}$ for selecting a frequency band is input to the constant-voltage generating circuit for the high frequency band 2411 and the constant-voltage generating circuit for the low frequency band 2412. If the selection signal $V_{SEL}$ is indicative of selection of the high band (for example, the selection signal $V_{SEL}$ is at a high level), the constant-voltage generating circuit for the high frequency band 2411 generates the constant voltages $V_{REFBH}$ and $V_{REFCH}$ similarly to the constant-voltage generating circuit 201 shown in FIG. 3. In this case, the constant-voltage generating circuit for the low frequency band 2412 sets the constant voltages $V_{REFBL}$ and $V_{REFCL}$ equal to, for example, a ground potential.

On the other hand, if the selection signal $V_{SEL}$ is indicative of selection of the low band (for example, the selection signal $V_{SEL}$ is at a low level), the constant-voltage generating circuit for the low frequency band 2412 generates the constant voltages $V_{REFBL}$ and $V_{REFCL}$ similarly to the constant-voltage generating circuit 201 shown in FIG. 3. In this case, the constant-voltage generating circuit for the high frequency band 2411 sets the constant voltages $V_{REFBH}$ and $V_{REFCH}$ equal to, for example, the ground potential.

The constant-voltage generating circuit for the high frequency band 2411 and the constant-voltage generating circuit for the low frequency band 2412 are configured equivalently to the constant-voltage generating circuit 201 except that the constant-voltage generating circuit for the high frequency band 2411 and the constant-voltage generating circuit for the low frequency band 2412 operate in accordance with the selection signal $V_{SEL}$.

The RF amplifying circuit for the high frequency band 2402 amplifies an RF signal in the high band ($RF_{INH}$). As a result, the amplified RF signal ($RF_{OUTH}$) is output via a matching network 2421. The internal configuration of the RF amplifying circuit for the high frequency band 2402 is equivalent to the internal configuration of the RF amplifying circuit 202 shown in FIG. 4 and includes a bias circuit 2431 and an amplifying circuit 2432. The configurations of the bias circuit 2431 and the amplifying circuit 2432 are equivalent to the configurations of the bias circuit 211 and the amplifying circuit 212 shown in FIG. 4 and will thus not be described below. In the RF amplifying circuit for the high frequency band 2402, the constant voltage $V_{REFBH}$ is applied to a base side of a transistor of the bias circuit 2431. The constant voltage $V_{REFCH}$ is applied to a collector side of the transistor of the bias circuit 2431.

The RF amplifying circuit for the low frequency band 2403 amplifies an RF signal in the low band ($RF_{INL}$), and outputs the amplified RF signal ($RF_{OUTL}$) via a matching network 2441. The internal configuration of the RF amplifying circuit for the low frequency band 2403 is equivalent to the internal configuration of the RF amplifying circuit 202 shown in FIG. 4 and includes a bias circuit 2451 and an amplifying circuit 2452. The configurations of the bias circuit 2451 and the amplifying circuit 2452 are equivalent to the configurations of the bias circuit 211 and the amplifying circuit 212 shown in FIG. 4 and will thus not be described below. In the RF amplifying circuit 2403 for the low frequency band, the constant voltage $V_{REFBL}$ is applied to a base side of a transistor of the bias circuit 2451. The constant voltage $V_{REFCL}$ is applied to a collector side of the transistor of the bias circuit 2451.

Thus, even when the power amplifying module 103C is adapted for multiple bands, since the constant voltages are supplied to the bias circuits 2431 and 2451 of the RF amplifying circuit, possible variations in gains of the RF amplifying circuit are prevented, allowing the linearity of the power amplifying module 103C to be improved.

In a common configuration in which the battery voltage $V_{BAT}$ is applied to a collector side of a transistor of a bias circuit, a leakage current may be generated in a bias circuit in an RF amplifying circuit for an unselected frequency band. Then, the amplifying circuit may operate, affecting an RF amplifying circuit for a selected frequency band.

On the other hand, in the power amplifying module 103C, the constant-voltage generating circuit 2401 can set the constant voltage supplied to the RF amplifying circuit for the unselected frequency band equal to, for example, the ground potential. Thus, in the RF amplifying circuit for the unselected frequency band, the operation of the bias circuit is completely stopped.

Preferred embodiments of the present invention have been described above. According to the preferred embodiments of the present invention described above, for example, as shown in FIG. 3 and FIG. 4, the constant voltage preferably is applied both to the base side of the transistor of the bias circuit and to the collector side of the transistor of the bias circuit. Consequently, a variation in bias output is prevented. Thus, a possible variation in gain of the RF amplifying circuit is prevented, allowing the linearity of the power amplifying module to be improved.

Furthermore, according to the preferred embodiments of the present invention described above, the constant voltage to be supplied to the bias circuit preferably is generated from the band gap reference voltage. This allows a possible variation in constant voltage to be supplied to the bias circuit to be prevented.

Furthermore, according to the preferred embodiments of the present invention, the level of the constant voltage supplied to the bias circuit preferably is changed in accordance with the temperature characteristic of the diode connected to the base side of the transistor of the bias circuit, for example, as shown in FIG. 5 to FIG. 7. This allows a possible variation in bias output caused by a change in temperature to be prevented.

Moreover, according to the preferred embodiments of the present invention, the constant voltage supplied to the bias circuit preferably is changed in accordance with the second- or higher-order change characteristic. This allows a possible variation in bias output caused by a change in temperature to be more accurately prevented.

Additionally, according to the preferred embodiments of the present invention, also when the amplifying circuit has a multistage configuration, a constant voltage preferably is supplied to the bias circuit for the amplifying circuit for each stage. Thus, even when the amplifying circuit includes multiple stages to increase the gain of the RF amplifying circuit, a possible variation in gain of the RF amplifying circuit is prevented, allowing the linearity of the power amplifying module to be improved.

In addition, according to the preferred embodiments of the present invention, when the amplifying circuit has a multi-stage configuration, the constant voltages supplied to the bias circuits for the amplifying circuits for the respective stages preferably are individually generated. This allows the flexibility of design of the RF amplifying circuit to be improved.

Furthermore, according to the preferred embodiments of the present invention, also when the power amplifying module is adapted for multiple bands, since the constant voltage preferably is supplied to the bias circuit in the RF amplifying circuit for each frequency band, a possible variation in gain of the RF amplifying circuit is prevented, allowing the linearity of the power amplifying module to be improved.

Moreover, the preferred embodiments of the present invention allow the constant voltage supplied to the RF amplifying circuit for the unselected frequency band to be set equal to, for example, the ground potential. This enables the operation of the bias circuit in the RF amplifying circuit for the unselected frequency band to be completely stopped, restraining the RF amplifying circuit for the unselected frequency band from being affected.

Additionally, the preferred embodiments of the present invention allow the constant-voltage generating circuit and the RF amplifying circuit to be located on different substrates. Thus, when the RF amplifying circuit is configured using, for example, an HBT, the constant-voltage generating circuit can be configured using, for example, a MOSFET, which is more inexpensive than the HBT. This enables a reduction in the manufacturing costs of the power amplifying module.

The preferred embodiments of the present invention are intended to facilitate understanding of the present invention and is not intended for limited interpretation of the present invention. The present invention may be changed/improved without departing from the spirits thereof and includes equivalents thereof.

For example, the preferred embodiments of the present invention described above illustrate the RF amplifying circuit preferably including one or two amplifying circuits. However, the number of amplifying circuits is not limited to one or two but may be three or more.

Furthermore, for example, the preferred embodiments of the present invention preferably include, as a power amplifying module adapted for multiple bands, the power amplifying module allowing selection of one of the two frequency bands, that is, the high band and the low band. However, three or more selectable frequency bands may be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power amplifying module comprising:
    a radio frequency amplifying circuit including:
        an amplifying circuit configured to amplify an input signal and output an amplified signal; and
        a bias circuit of an emitter-follower type configured to bias the amplifying circuit to an operating point; and
    a constant voltage generating circuit configured to generate, from a first reference voltage, a first constant voltage applied to a base side of a transistor of the bias circuit and a second constant voltage applied to a collector side of the transistor; wherein
    the constant voltage generating circuit includes:
        a temperature characteristic compensating circuit configured to generate a second reference voltage from the first reference voltage, the second reference voltage changing according to a temperature characteristic of a diode connected to the base side of the transistor of the bias circuit; and
        a voltage generating circuit configured to generate the first and second constant voltages having levels corresponding to the second reference voltage.

2. The power amplifying module according to claim 1, wherein the constant voltage generating circuit includes a band gap circuit configured to generate the first reference voltage from a power supply voltage.

3. The power amplifying module according to claim 1 wherein the temperature characteristic compensating circuit includes:
    a constant current generating circuit configured to generate a constant current;
    an adjustment current generating circuit configured to generate an adjustment current changing according to temperature; and
    a current-voltage conversion circuit configured to convert an output current obtained from the constant current and the adjustment current into the second reference voltage.

4. The power amplifying module according to claim 1 wherein the temperature characteristic compensating circuit is configured to change the second reference voltage in accordance with a second-order or higher-order change characteristic.

5. The power amplifying module according to claim 1, wherein
    the amplifying circuit includes:
        a first amplifying circuit configured to amplify the input signal and output the amplified signal; and
        a second amplifying circuit configured to amplify the signal output by the first amplifying circuit and output the amplified signal;
    the bias circuit includes:
        a first bias circuit of an emitter-follower type configured to bias the first amplifying circuit to an operating point; and
        a second bias circuit of an emitter-follower type configured to bias the second amplifying circuit to an operating point; wherein
    the first constant voltage is applied to a base side of a transistor of the first bias circuit and to a base side of a transistor of the second bias circuit; and
    the second constant voltage is applied to a collector side of the transistor of the first bias circuit and to a collector side of the transistor of the second bias circuit.

6. The power amplifying module according to claim 1, wherein
    the amplifying circuit includes:
        a first amplifying circuit configured to amplify the input signal and output the amplified signal; and
        a second amplifying circuit configured to amplify the signal output by the first amplifying circuit and output the amplified signal; and
    the bias circuit includes:
        a first bias circuit of an emitter-follower type configured to bias the first amplifying circuit to an operating point; and
        a second bias circuit of an emitter-follower type configured to bias the second amplifying circuit to an operating point; and the constant-voltage generating circuit includes:
a first constant-voltage generating circuit configured to generate, from the first reference voltage, a first constant voltage applied to a base side of a transistor of the first bias circuit and a second constant voltage applied to a collector side of the transistor of the first bias circuit; and
a second constant-voltage generating circuit configured to generate, from the first reference voltage, a third constant voltage applied to a base side of a transistor of the second bias circuit and a fourth constant voltage applied to a collector side of the transistor of the second bias circuit.

7. The power amplifying module according to claim 1, wherein
the radio frequency amplifying circuit includes:
a first radio frequency amplifying circuit including a first amplifying circuit configured to amplify an input signal in a first frequency band and output the amplified signal, and a first bias circuit of an emitter-follower type configured to bias the first amplifying circuit to an operating point; and
a second radio frequency amplifying circuit including a second amplifying circuit configured to amplify an input signal in a second frequency band and output the amplified signal, and a second bias circuit of an emitter-follower type configured to bias the second amplifying circuit to an operating point;
the constant-voltage generating circuit includes:
a first constant-voltage generating circuit configured to generate, from the first reference voltage, a first constant voltage applied to a base side of a transistor of the first bias circuit and a second constant voltage applied to a collector side of the transistor of the first bias circuit; and
a second constant-voltage generating circuit configured to generate, from the first reference voltage, a third constant voltage applied to a base side of a transistor of the second bias circuit and a fourth constant voltage applied to a collector side of the transistor of the second bias circuit.

8. The power amplifying module according to claim 1, wherein the radio frequency amplifying circuit and the constant-voltage generating circuit are located on different substrates.

9. The power amplifying module according to claim 2, wherein the temperature characteristic compensating circuit includes:
a constant current generating circuit configured to generate a constant current;
an adjustment current generating circuit configured to generate an adjustment current changing according to temperature; and
a current-voltage conversion circuit configured to convert an output current obtained from the constant current and the adjustment current into the second reference voltage.

10. The power amplifying module according to claim 2, wherein the temperature characteristic compensating circuit is configured to change the second reference voltage in accordance with a second-order or higher-order change characteristic.

11. The power amplifying module according to claim 9, wherein the temperature characteristic compensating circuit is configured to change the second reference voltage in accordance with a second-order or higher-order change characteristic.

12. The power amplifying module according to claim 11, wherein
the amplifying circuit includes:
a first amplifying circuit configured to amplify the input signal and output the amplified signal; and
a second amplifying circuit configured to amplify the signal output by the first amplifying circuit and output the amplified signal;
the bias circuit includes:
a first bias circuit of an emitter-follower type configured to bias the first amplifying circuit to an operating point; and
a second bias circuit of an emitter-follower type configured to bias the second amplifying circuit to an operating point; wherein
the first constant voltage is applied to a base side of a transistor of the first bias circuit and to a base side of a transistor of the second bias circuit; and
the second constant voltage is applied to a collector side of the transistor of the first bias circuit and to a collector side of the transistor of the second bias circuit.

13. The power amplifying module according to claim 11, wherein
the amplifying circuit includes:
a first amplifying circuit configured to amplify the input signal and output the amplified signal; and
a second amplifying circuit configured to amplify the signal output by the first amplifying circuit and output the amplified signal; and
the bias circuit includes:
a first bias circuit of an emitter-follower type configured to bias the first amplifying circuit to an operating point; and
a second bias circuit of an emitter-follower type configured to bias the second amplifying circuit to an operating point; and
the constant-voltage generating circuit includes:
a first constant-voltage generating circuit configured to generate, from the first reference voltage, a first constant voltage applied to a base side of a transistor of the first bias circuit and a second constant voltage applied to a collector side of the transistor of the first bias circuit; and
a second constant-voltage generating circuit configured to generate, from the first reference voltage, a third constant voltage applied to a base side of a transistor of the second bias circuit and a fourth constant voltage applied to a collector side of the transistor of the second bias circuit.

14. The power amplifying module according to claim 11, wherein
the radio frequency amplifying circuit includes:
a first radio frequency amplifying circuit including a first amplifying circuit configured to amplify an input signal in a first frequency band and output the amplified signal, and a first bias circuit of an emitter-follower type configured to bias the first amplifying circuit to an operating point; and
a second radio frequency amplifying circuit including a second amplifying circuit configured to amplify an input signal in a second frequency band and output the amplified signal, and a second bias circuit of an emitter-follower type configured to bias the second amplifying circuit to an operating point;
the constant-voltage generating circuit includes:
a first constant-voltage generating circuit configured to generate, from the first reference voltage, a first constant voltage applied to a base side of a transistor of the first bias circuit and a second constant voltage applied to a collector side of the transistor of the first bias circuit; and a second constant-voltage generating circuit configured to generate, from the first reference voltage, a third constant voltage applied to a base side of a transistor of the second bias circuit and a fourth constant voltage applied to a collector side of the transistor of the second bias circuit.

15. The power amplifying module according to claim 14, wherein
the first constant-voltage generating circuit is configured to generate the first and second constant voltages when a selection signal to select a frequency band is indicative of selection of the first frequency band; and
the second constant-voltage generating circuit is configured to generate the third and fourth constant voltages when the selection signal is indicative of selection of the second frequency band.

16. The power amplifying module according to claim 13, wherein the radio frequency amplifying circuit and the constant-voltage generating circuit are located on different substrates.

17. The power amplifying module according to claim 15, wherein the radio frequency amplifying circuit and the constant-voltage generating circuit are located on different substrates.

18. A power amplifying module comprising:
a radio frequency amplifying circuit including:
an amplifying circuit configured to amplify an input signal and output an amplified signal; and
a bias circuit of an emitter-follower type configured to bias the amplifying circuit to an operating point; and
a constant voltage generating circuit configured to generate, from a first reference voltage, a first constant voltage applied to a base side of a transistor of the bias circuit and a second constant voltage applied to a collector side of the transistor; wherein
the amplifying circuit includes:
a first amplifying circuit configured to amplify the input signal and output the amplified signal; and
a second amplifying circuit configured to amplify the signal output by the first amplifying circuit and output the amplified signal; and
the bias circuit includes:
a first bias circuit of an emitter-follower type configured to bias the first amplifying circuit to an operating point; and
a second bias circuit of an emitter-follower type configured to bias the second amplifying circuit to an operating point; and
the constant-voltage generating circuit includes:
a first constant-voltage generating circuit configured to generate, from the first reference voltage, a first constant voltage applied to a base side of a transistor of the first bias circuit and a second constant voltage applied to a collector side of the transistor of the first bias circuit; and
a second constant-voltage generating circuit configured to generate, from the first reference voltage, a third constant voltage applied to a base side of a transistor of the second bias circuit and a fourth constant voltage applied to a collector side of the transistor of the second bias circuit.

19. The power amplifying module according to claim 18, wherein the constant voltage generating circuit includes a band gap circuit configured to generate the first reference voltage from a power supply voltage.

20. The power amplifying module according to claim 18, wherein the radio frequency amplifying circuit and the constant-voltage generating circuit are located on different substrates.

21. The power amplifying module according to claim 19, wherein the radio frequency amplifying circuit and the constant-voltage generating circuit are located on different substrates.

22. A power amplifying module comprising:
a radio frequency amplifying circuit including:
an amplifying circuit configured to amplify an input signal and output an amplified signal; and
a bias circuit of an emitter-follower type configured to bias the amplifying circuit to an operating point; and
a constant voltage generating circuit configured to generate, from a first reference voltage, a first constant voltage applied to a base side of a transistor of the bias circuit and a second constant voltage applied to a collector side of the transistor; wherein
the radio frequency amplifying circuit includes:
a first radio frequency amplifying circuit including a first amplifying circuit configured to amplify an input signal in a first frequency band and output the amplified signal, and a first bias circuit of an emitter-follower type configured to bias the first amplifying circuit to an operating point; and
a second radio frequency amplifying circuit including a second amplifying circuit configured to amplify an input signal in a second frequency band and output the amplified signal, and a second bias circuit of an emitter-follower type configured to bias the second amplifying circuit to an operating point;
the constant-voltage generating circuit includes:
a first constant-voltage generating circuit configured to generate, from the first reference voltage, a first constant voltage applied to a base side of a transistor of the first bias circuit and a second constant voltage applied to a collector side of the transistor of the first bias circuit; and
a second constant-voltage generating circuit configured to generate, from the first reference voltage, a third constant voltage applied to a base side of a transistor of the second bias circuit and a fourth constant voltage applied to a collector side of the transistor of the second bias circuit.

23. The power amplifying module according to claim 22, wherein the constant voltage generating circuit includes a band gap circuit configured to generate the first reference voltage from a power supply voltage.

24. The power amplifying module according to claim 22, wherein
the first constant-voltage generating circuit is configured to generate the first and second constant voltages when a selection signal to select a frequency band is indicative of selection of the first frequency band; and
the second constant-voltage generating circuit is configured to generate the third and fourth constant voltages when the selection signal is indicative of selection of the second frequency band.

25. The power amplifying module according to claim 22, wherein the radio frequency amplifying circuit and the constant-voltage generating circuit are located on different substrates.

26. The power amplifying module according to claim 23, wherein the first constant-voltage generating circuit is configured to generate the first and second constant voltages when a selection signal to select a frequency band is indicative of selection of the first frequency band; and the second constant-voltage generating circuit is configured to generate the third and fourth constant voltages when the selection signal is indicative of selection of the second frequency band.

27. The power amplifying module according to claim 23, wherein the radio frequency amplifying circuit and the constant-voltage generating circuit are located on different substrates.

28. The power amplifying module according to claim 26, wherein the radio frequency amplifying circuit and the constant-voltage generating circuit are located on different substrates.

* * * * *